(12) United States Patent
Umise

(10) Patent No.: US 11,476,140 B2
(45) Date of Patent: Oct. 18, 2022

(54) SUBSTRATE ACCOMMODATING UNIT AND MAINTENANCE METHOD FOR VACUUM TRANSFER UNIT IN SUBSTRATE TRANSFER APPARATUS

(71) Applicant: TOKYO ELECTRON LIMITED, Tokyo (JP)

(72) Inventor: Takuya Umise, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/083,726

(22) Filed: Oct. 29, 2020

(65) Prior Publication Data

US 2021/0134634 A1 May 6, 2021

(30) Foreign Application Priority Data

Nov. 1, 2019 (JP) .............................. JP2019-200161

(51) Int. Cl.
| | |
|---|---|
| H01L 21/67 | (2006.01) |
| C23C 14/56 | (2006.01) |
| H01L 21/677 | (2006.01) |
| C23C 16/458 | (2006.01) |

(52) U.S. Cl.
CPC .... *H01L 21/67712* (2013.01); *C23C 16/4587* (2013.01); *H01L 21/67017* (2013.01); *H01L 21/67178* (2013.01)

(58) Field of Classification Search
None
See application file for complete search history.

(56) References Cited

U.S. PATENT DOCUMENTS 6,395,094 B1 * 5/2002 Tanaka .............. H01L 21/67109
118/719

FOREIGN PATENT DOCUMENTS

| JP | H11-087467 A | 3/1999 |
| JP | 2001-319842 A | 11/2001 |
| JP | 2015-076458 A | 4/2015 |

* cited by examiner

*Primary Examiner* — Karla A Moore
(74) *Attorney, Agent, or Firm* — Fenwick & West LLP

(57) ABSTRACT

A substrate accommodating unit is disposed adjacent to each of consecutively arranged vacuum transfer units. The substrate accommodating unit includes a hollow housing having, on one sidewall in an arrangement direction of the vacuum transfer units, a loading/unloading port for loading/unloading a substrate into/from the adjacent vacuum transfer unit, a vertically movable partition member disposed in the housing, and a driving mechanism for vertically moving the partition member. When an inner space of the housing is divided horizontally into a first space on a loading/unloading port side and a second space on an opposite side of the loading/unloading port side, the partition member is vertically moved from a state where the first space and the second space communicate with each other to thereby airtightly separate the first space and the second space with the partition member.

10 Claims, 14 Drawing Sheets

SUBSTRATE ACCOMMODATING UNIT AND MAINTENANCE METHOD FOR VACUUM TRANSFER UNIT IN SUBSTRATE TRANSFER APPARATUS

CROSS-REFERENCE TO RELATED APPLICATION

This application claims priority to Japanese Patent Application No. 2019-200161, filed on Nov. 1, 2019, the entire contents of which are incorporated herein by reference.

TECHNICAL FIELD

The present disclosure relates to a substrate accommodating unit and a maintenance method for a vacuum transfer unit in a substrate transfer apparatus.

BACKGROUND

Japanese Patent Application Publication No. 2001-319842 discloses a multi-cluster tool having four processing chambers for a physical vapor deposition (PVD) process, for example. The multi-cluster tool has a first transfer space and a second transfer space, each having therein a robotic wafer transport mechanism, and a preclean chamber is disposed between the first transfer space and the second transfer space. The preclean chamber is also used as a pass-through chamber that forms a connection between the first transfer space and the second transfer space that are adjacent to each other.

The technique of the present disclosure is provided to downsize a substrate transfer apparatus in which vacuum transfer units are consecutively arranged and substrate accommodating units are disposed adjacent to the vacuum transfer units in an arrangement direction of the vacuum transfer units.

SUMMARY

In accordance with an aspect of the present disclosure, there is provided a substrate accommodating unit of a substrate transfer apparatus in which multiple vacuum transfer units, each having therein a substrate transfer mechanism configured to hold and transfer a substrate, are arranged consecutively, the substrate accommodating unit being disposed adjacent to each of the vacuum transfer units in an arrangement direction of the vacuum transfer units. The substrate accommodating unit includes: a hollow housing having, on one sidewall in the arrangement direction of the vacuum transfer units, a loading/unloading port for loading and unloading a substrate into and from the adjacent vacuum transfer unit; a partition member disposed in the housing and configured to be vertically movable; and a driving mechanism configured to vertically move the partition member. Further, when an inner space of the housing is divided horizontally into a first space on a loading/unloading port side and a second space on an opposite side of the loading/unloading port side, the partition member is vertically moved from a state where the first space and the second space communicate with each other to thereby airtightly separate the first space and the second space with the partition member.

BRIEF DESCRIPTION OF THE DRAWINGS

The objects and features of the present disclosure will become apparent from the following description of embodiments, given in conjunction with the accompanying drawings, in which.

DETAILED DESCRIPTION

Figure 1:
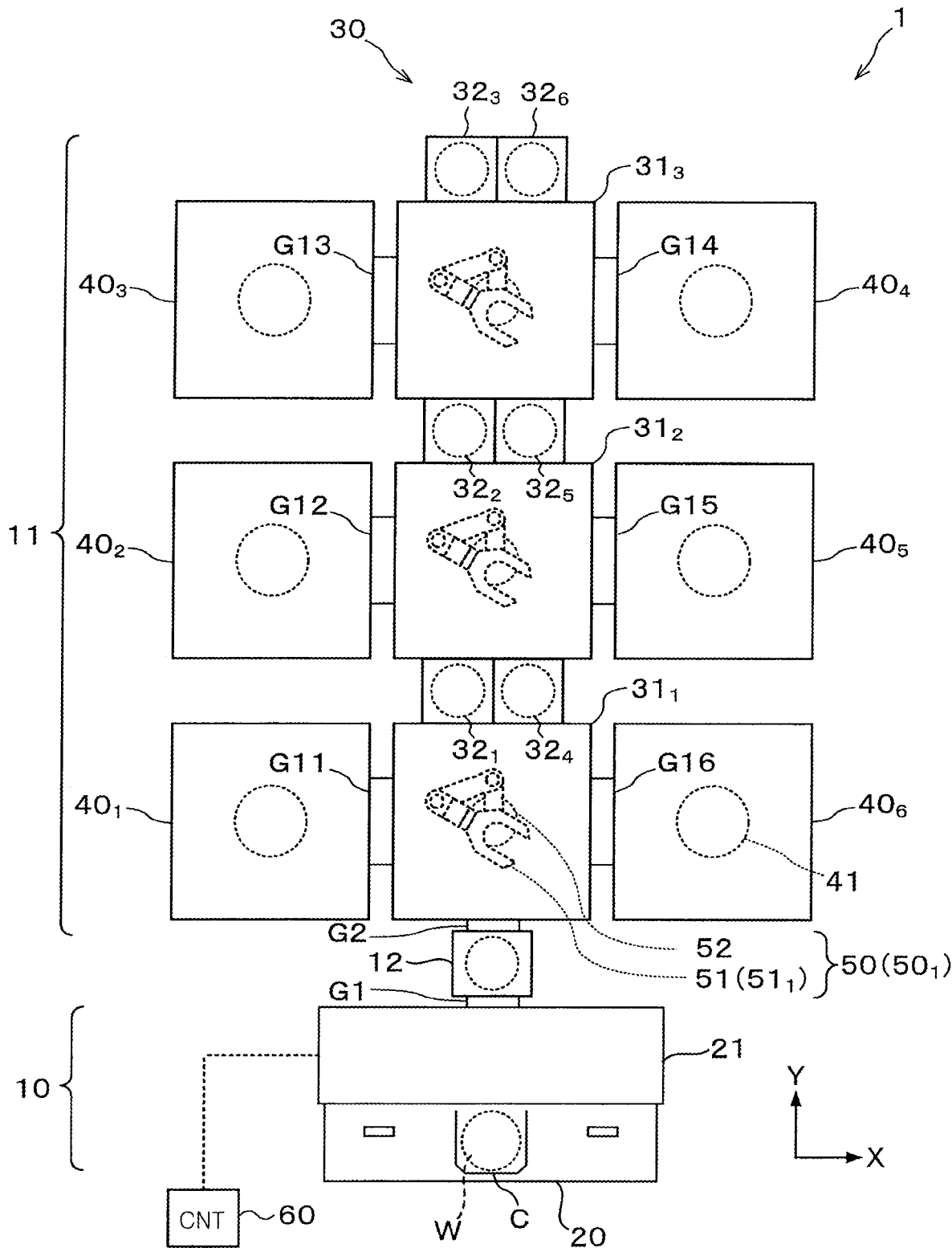
FIG. 1 is a schematic plan view showing an example of a processing system including wafer accommodating chambers serving as substrate accommodating units and a vacuum transfer apparatus serving as a substrate transfer apparatus according to an embodiment.

In a manufacturing process of a semiconductor device or the like, various treatments such as film formation and the like are performed on a substrate such as a semiconductor wafer (hereinafter referred to as "wafer") in individual vacuum processing units. The film formation is performed multiple times on a single substrate, if necessary. Therefore, in order to improve throughput, a processing system for consecutively performing various processes without exposing a substrate to the atmosphere is provided. In the processing system, multiple vacuum processing units are provided to perform the same treatment or different treatments, a common transfer device is provided to transfer a substrate under a vacuum atmosphere, and the multiple vacuum processing units are connected to one another via the common transfer device.

In the substrate transfer apparatus used in the above-described processing system, multiple vacuum transfer units, each having therein a transfer mechanism for holding and transferring a substrate, may be arranged consecutively in a horizontal plane. Further, in this case, substrate accommodating units, each of which is configured to accommodate substrates, may be disposed adjacent to the vacuum transfer units in the arrangement direction of the vacuum transfer units, e.g., between the vacuum transfer units. Each of the substrate accommodating units is used for transferring the substrate between the adjacent vacuum transfer units without passing through a vacuum processing unit. Further, it is considered to allow the substrate accommodating unit to have, for example, a heating function to heat the substrates in the substrate accommodating unit.

For example, in the multi-cluster tool disclosed in Japanese Patent Application Publication No. 2001-319842, the preclean chamber that is also used as the pass-through chamber is disposed between the first transfer space and the second transfer space, each including a robotic wafer transport mechanism, as described above.

When the substrate accommodating unit is disposed adjacent to each of the vacuum transfer units in the arrangement direction of the vacuum transfer units in the substrate transfer apparatus as described above, a gate valve is conventionally disposed between the vacuum transfer unit and the substrate accommodating unit for the following reasons.

(a) In the case where the substrate accommodating unit is disposed between the vacuum transfer units, when the vacuum transfer unit and the vacuum processing unit communicate with each other to transfer the substrate therebetween, a pressure change caused by such communication occurs only in the corresponding vacuum transfer unit adjacent to the vacuum processing unit. The gate valve prevents the pressure change from affecting the other vacuum transfer units.

(b) When the substrate accommodating unit is disposed between the vacuum transfer units, the gate value allows only one of the vacuum transfer units to be opened to the atmosphere during maintenance.

(c) When the substrate accommodating unit has a heating function, the gate valve prevents components vaporized from the heated substrate from flowing into the vacuum transfer unit and adversely affecting the substrate transferred from the vacuum transfer unit.

However, the footprint of the substrate transfer apparatus is increased in such a substrate transfer apparatus in which the substrate accommodating unit is disposed adjacent to each of the vacuum transfer units in the arrangement direction of the vacuum transfer units and the gate valve is disposed between the vacuum transfer units and the substrate accommodating unit. Further, the footprint of the processing system including the substrate transfer apparatus is increased.

Therefore, the technique of the present disclosure is provided to achieve downsizing of the substrate transfer apparatus in which the vacuum transfer units are arranged consecutively and the substrate accommodating unit is disposed adjacent to each of the vacuum transfer units in the arrangement direction of the vacuum transfer units.

Hereinafter, configurations of the substrate accommodating unit and the substrate transfer apparatus according to the present embodiment will be described with reference to the drawings. In this specification, like reference numerals will be given to like parts having substantially the same functions and redundant description thereof will be omitted.

FIG. 1 is a schematic plan view showing an example of a processing system 1 including wafer accommodating chambers serving as substrate accommodating units and a vacuum transfer apparatus serving as a substrate transfer apparatus according to the present embodiment. In the following example, the processing system 1 is used for manufacturing a magnetoresistive element and includes a vacuum processing unit for performing film formation on a wafer W as a substrate.

The processing system 1 includes a cassette station 10 for loading/unloading a cassette C capable of accommodating a plurality of wafers W and a processing station 11 including multiple vacuum processing units for performing film formation on the wafers W. The cassette station 10 and the processing station 11 are integrally connected to form the processing system 1. The cassette station 10 and the processing station 11 are connected through a load-lock chamber 12. The load-lock chamber 12 is configured to connect an atmospheric pressure transfer device 21 to a vacuum transfer apparatus 30 to be described later. An inner atmosphere of the load-lock chamber 12 can be switched between an atmospheric pressure state and a vacuum state.

The cassette station 10 includes a cassette mounting table 20 and an atmospheric pressure transfer device 21. The cassette station 10 may further include an orienter (not shown) for adjusting the orientation of the wafer W.

The cassette mounting table 20 is disposed at a front end (negative side of the Y direction in FIG. 1) of the processing system 1. Multiple cassettes, e.g., three cassettes C, can be mounted on the cassette mounting table 20.

The atmospheric pressure transfer device 21 is configured to transfer the wafer W under an atmospheric pressure state by a wafer transfer mechanism (not shown). The wafer transfer mechanism includes a transfer arm for holding the wafer W substantially horizontally. The transfer arm is configured to be rotatable, extensible and contractible in a horizontal direction and move vertically. Further, the wafer transfer mechanism is configured to transfer the wafer W while holding the wafer W on the transfer arm.

The load-lock chamber 12 is connected to a rear side (positive side of the Y direction in FIG. 1) of the atmospheric pressure transfer device 21 through a gate valve G1. The vacuum transfer apparatus 30 of the processing station 11, specifically a vacuum transfer chamber $31_1$ to be described later, is connected to a rear side (positive side of the Y direction in FIG. 1) of the load-lock chamber 12 through a gate valve G2.

The processing station 11 includes the vacuum transfer apparatus 30 and multiple (six in this example) vacuum processing chambers $40_1$ to $40_6$ (hereinafter, may be collectively referred to as "vacuum processing chamber 40") as the vacuum processing units. The inner atmosphere of each of the vacuum transfer apparatus 30 and the vacuum processing chamber 40 is maintained in an atmosphere (vacuum atmosphere) lower than the atmospheric pressure during a series of processes performed on the wafer W in the processing system 1.

In the vacuum transfer apparatus 30, multiple (three in this example) vacuum transfer chambers $31_1$ to $31_3$ (hereinafter, collectively referred to as "vacuum transfer chamber 31") as the vacuum transfer units are consecutively arranged in a substantially horizontal plane. Further, in the vacuum transfer apparatus 30, wafer accommodating chambers $32_1$ to $32_6$ (hereinafter, collectively referred to as "wafer accommodating chamber 32") as substrate accommodating units are disposed adjacent to the vacuum transfer chamber 31 in the arrangement direction (Y direction in FIG. 1) of the vacuum transfer chambers 31. Specifically, the wafer accommodating chambers $32_1$, $32_2$, $32_4$, and $32_5$ are arranged between the adjacent vacuum transfer chambers 31, and the wafer accommodating chambers $32_3$ and $32_6$ are arranged at the rear side of the vacuum transfer chamber $31_3$ disposed at the rear end (positive side of the Y direction in FIG. 1).

The vacuum transfer apparatus 30 is formed by integrating the multiple vacuum transfer chambers 31 arranged along the Y direction of FIG. 1 and the wafer accommodating chambers 32 arranged between the adjacent vacuum transfer chambers 31. Each of the vacuum transfer chamber 31 and the wafer accommodating chamber 32 has a housing formed in a substantially polygonal shape in plan view. The vacuum transfer apparatus 30 has a housing formed by integrating the housings of the vacuum transfer chambers 31 and the wafer accommodating chambers 32.

The vacuum processing chambers $40_1$ to $40_3$ are disposed at one outer side in a width direction of the vacuum transfer apparatus 30 (negative side of the X direction in FIG. 1) and arranged along a depth direction of the vacuum transfer apparatus 30 (the arrangement direction of the vacuum transfer chambers 31, i.e., the Y direction in FIG. 1). Each of the vacuum processing chambers $40_1$ to $40_3$ is connected to the corresponding vacuum transfer chamber 31. Specifically, the vacuum processing chamber $40_1$ is connected to the vacuum transfer chamber $31_1$ through a gate valve G11; the vacuum processing chamber $40_2$ is connected to the vacuum transfer chamber $31_2$ through a gate valve G12; and the vacuum processing chamber $40_3$ is connected to the vacuum transfer chamber $31_3$ through a gate valve G13.

Further, vacuum processing chambers $40_4$ to $40_6$ are disposed at the other outer side in the width direction of the vacuum transfer apparatus 30 (positive side of the X direction in FIG. 1) and arranged along the depth direction of the vacuum transfer apparatus 30 (the Y direction in FIG. 1). Each of the vacuum processing chambers $40_4$ to $40_6$ is connected to the corresponding vacuum transfer chamber 31. Specifically, the vacuum processing chamber $40_4$ is connected to the vacuum transfer chamber $31_3$ through a gate valve G14; the vacuum processing chamber $40_5$ is connected to the vacuum transfer chamber $31_2$ through a gate valve G15; and the vacuum processing chamber $40_6$ is connected to the vacuum transfer chamber $31_1$ through a gate valve G16.

Each of the vacuum transfer chambers 31 allows a wafer W that is unloaded from a unit (for example, the vacuum processing chamber 40, the wafer accommodating chamber 32, or the load-lock chamber 12) adjacent to the corresponding vacuum transfer chamber 31 to be transferred to another unit adjacent to the corresponding vacuum transfer chamber 31.

A wafer transfer mechanism 50 serving as a substrate transfer mechanism is disposed in each of the vacuum transfer chambers 31. The wafer transfer mechanism 50 includes a transfer arm 51 for holding the wafer W substantially horizontally. The transfer arm 51 is configured to be rotatable, extensible and contractible in the horizontal direction. Further, the wafer transfer mechanism 50 includes a lifter 52 disposed under the transfer arm 51. The transfer arm 51 is configured to be vertically movable by the lifter 52. The wafer transfer mechanism 50 is configured to transfer the wafer W while holding the wafer W on the transfer arm 51. In the following description, a wafer transfer mechanism $50n$ and a transfer arm $51n$ (n being 1 to 3) indicate the wafer transfer mechanism 50 disposed in a vacuum transfer chamber $31n$ and the transfer arm 51 of the wafer transfer mechanism 50, respectively.

Among the wafer accommodating chambers 32, each of the wafer accommodating chambers $32_1$ to $32_3$ and $32_6$ temporarily accommodates the wafer W and is configured to perform a process of controlling the temperature of the wafer W to a temperature higher or lower than a room temperature or a process of controlling the temperature of the wafer W to the room temperature. Specifically, the wafer accommodating chamber 32 performs a high-temperature heating process of heating the wafer W to a desired temperature, e.g., in a range from 300° C. to 500° C., higher than the room temperature or maintaining the wafer W at the desired temperature, a low-temperature cooling process of cooling the wafer W to a desired temperature lower than the room temperature or maintaining the wafer W at the desired temperature, or a room-temperature process of cooling or heating the wafer W to the room temperature or maintaining the wafer W at the room temperature. In the following description, the wafer accommodating chambers $32_1$ to $32_3$ and $32_6$ may be referred to as "temperature control chambers $32_1$ to $32_3$ and $32_6$," and the temperature control chambers $32_1$ to $32_3$ and $32_6$ may be collectively referred to as "temperature control chamber 32."

In the following description, among the temperature control chambers 32, the temperature control chambers $32_2$ and $32_3$ are configured to perform the high-temperature heating process; the temperature control chamber $32_1$ is configured to perform the low-temperature cooling process; and the temperature control chamber $32_6$ is configured to perform the room-temperature process.

The specific configuration of the temperature control chamber 32 will be described later.

Among the wafer accommodating chambers 32, each of the wafer accommodating chambers $32_4$ and $32_5$ temporarily stores and relays the wafer W during the transfer of the wafer W between the adjacent vacuum transfer chambers 31. Through each inner space of the wafer accommodating chambers $32_4$ and $32_5$, the inner spaces of the adjacent vacuum transfer chambers 31 communicate with each other, so that the wafer W can be transferred therebetween. Hereinafter, the wafer accommodating chambers $32_4$ and $32_5$ may be referred to as "relay chambers $32_4$ and $32_5$," and the relay chambers $32_4$ and $32_5$ may be collectively referred to as "relay chamber 32."

The specific configuration of the relay chamber 32 will be described later.

The relay chamber $32_4$ and the temperature control chamber $32_1$ are adjacent to each other in the width direction of the vacuum transfer apparatus 30 (X direction in FIG. 1). The relay chamber $32_5$ and the temperature control chamber $32_2$ are adjacent to each other in the width direction (X direction in FIG. 1). The temperature control chamber $32_6$ and the temperature control chamber $32_3$ are adjacent to each other in the width direction (X direction in FIG. 1). Further, the relay chamber $32_4$ and the temperature control chamber $32_1$ are disposed between the vacuum transfer chamber $31_1$ and the vacuum transfer chamber $31_2$, and the relay chamber $32_5$ and the temperature control chamber $32_2$ are disposed between the vacuum transfer chamber $31_2$ and the vacuum transfer chamber $31_3$. The temperature control chamber $32_3$ and the temperature control chamber $32_6$ are disposed at the rear side (positive side of the Y direction in FIG. 1) of the vacuum transfer chamber $31_3$.

The vacuum processing chamber 40 is configured to perform film formation such as PVD on the wafer W. A substrate support 41 on which the wafer W is horizontally placed is disposed in the vacuum processing chamber 40. An electrostatic chuck is disposed on the substrate support 41, if necessary. Further, the substrate support 41 has a flow channel for a temperature control medium or a heating plate as a temperature control mechanism (not shown) for controlling a temperature of the wafer W placed on the substrate support 41 to a desired temperature.

For example, an electrode layer or a base layer is formed in the vacuum processing chamber $40_1$; a fixed layer of a magnetoresistive element is formed in the vacuum processing chamber $40_2$; and a reference layer is formed in the vacuum processing chamber $40_3$. Further, for example, a barrier layer is formed in the vacuum processing chamber $40_4$; a free layer is formed in the vacuum processing chamber $40_5$; and a cap layer or an electrode layer is formed in the vacuum processing chamber $40_6$.

The processing system 1 configured as described above includes a controller (CNT) 60. The controller 60 is, e.g., a computer including, for example, a CPU and a memory and includes a program storage unit (not shown). The program storage unit is configured to store, e.g., programs for implementing wafer processing to be described later in the processing system 1. The programs may be stored in a computer-readable storage medium and installed in the controller 60 from the storage medium. Further, a part or all of the programs may be realized by a dedicated hardware (circuit board).

In the processing system 1 configured as described above, no gate valve is provided between the vacuum transfer chamber 31 and the wafer accommodating chamber 32 adjacent to the vacuum transfer chamber 31 in the depth direction of the vacuum transfer apparatus 30 (the arrangement direction of the vacuum transfer chambers 31). Instead, a valve body 141 to be described later is disposed between the vacuum transfer chamber 31 and the wafer accommodating chamber 32 adjacent to the vacuum transfer chamber 31 in the depth direction (Y direction in FIG. 1).

Next, the temperature control chamber $32_2$ will be described.

Figure 2:
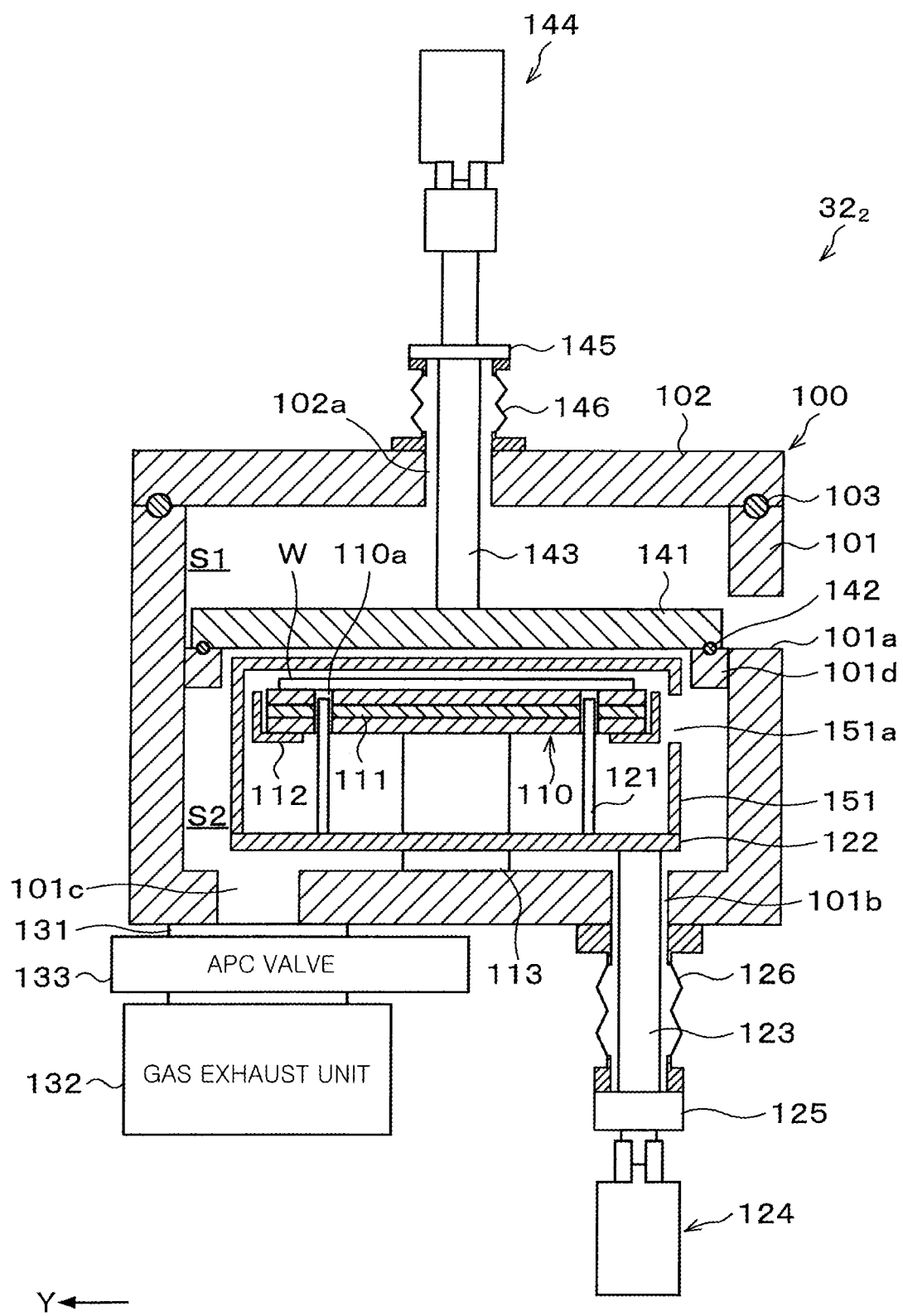
FIG. 2 is a vertical cross-sectional view of a temperature control chamber.
Figure 3:
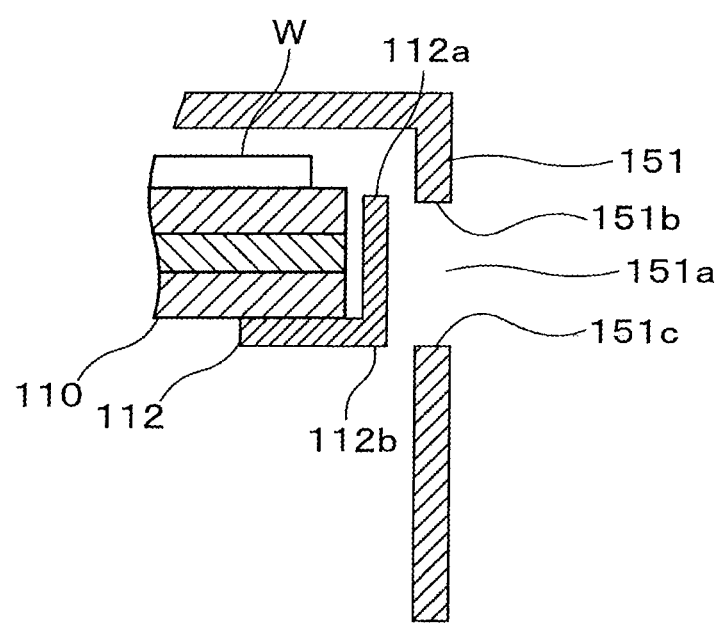
FIG. 3 is a partially enlarged view of FIG. 2.

FIG. 2 is a vertical cross-sectional view of the temperature control chamber $32_2$. FIG. 3 is a partially enlarged view of FIG. 2.

As shown in FIG. 2, the temperature control chamber $32_2$ has a hollow housing 100. The housing 100 includes a cylindrical housing body 101 having a top opening and a closed bottom, and a lid 102 that closes the top opening of the housing body 101. An O-ring 103 is disposed between the housing body 101 and the lid 102.

The housing body 101 has, on a sidewall of a front side thereof (negative side of the Y direction in FIG. 2), a loading/unloading port 101a for loading and unloading the wafer W into and from the adjacent vacuum transfer chamber $31_2$.

The inner space of the housing 100 of the temperature control chamber $32_2$ and the inner space of the vacuum transfer chamber $31_2$ communicate with each other through the loading/unloading port 101a.

In the following description, the inner space of the housing 100 is divided horizontally into a first space S1 where the loading/unloading port 101a is disposed (the loading/unloading port side) and a second space S2 where the loading/unloading port 101a is not disposed (the opposite side of the loading/unloading port side).

The housing body 101 does not have, on a sidewall of a rear side thereof (positive side of the Y direction in FIG. 2), a loading/unloading port for loading and unloading the wafer W into and from the adjacent vacuum transfer chamber $31_3$.

In the housing 100, a substrate support 110 having a circular shape in plan view, on which the wafer W is horizontally placed, is disposed below the loading/unloading port 101a, i.e., in the second space S2. Further, a heating mechanism 111 is disposed in the substrate support 110 to perform the above-described high-temperature heating process on the wafer W placed on the substrate support 110. The heating mechanism 111 is, e.g., a resistance heater.

The substrate support 110 includes a cover member 112 that is an annular member that extends along a circumferential direction to cover an outer peripheral region of a bottom surface and a side circumferential surface of the substrate support 110. By providing the cover member 112, it is possible to suppress that the heat from the substrate support 110 affects the outside member such as the housing 100, and it is also possible to improve the heating efficiency of the substrate support 110 with the heating mechanism 111.

Further, an upper end portion of a support column 113 extending in the vertical direction is connected to the center of the bottom surface of the substrate support 110. A lower end portion of the support column 113 is connected to a bottom wall of the housing body 101.

Vertically movable support pins 121 serving as substrate support pins are disposed in the housing 100. The support pins 121 are vertically moved to protrude beyond and retract below the upper surface of the substrate support 110 through through-holes 110a formed in the substrate support 110. Accordingly, the wafer W can be transferred between the substrate support 110 and a transfer arm $51_2$ of a wafer transfer mechanism $50_2$ in the vacuum transfer chamber $31_2$ that enters the housing 100.

Lower ends of the support pins 121 are connected to an upper surface of a support plate 122 disposed below the substrate support 110 in the housing 100. The support plate 122 is formed in, e.g., a disc shape. The support plate 122 has a hole (not shown), and the support column 113 of the substrate support 110 extends through the hole. An upper end of a support column 123 extending in the vertical direction is connected to a bottom surface of the support plate 122. A lower end of the support column 123 extends through an opening 101b formed in the bottom wall of the housing body 101 to the outside of the housing 100 and is connected to a lifting mechanism 124 serving as a pin driving mechanism. The lifting mechanism 124 has, e.g., a motor or a ball screw, and the support pins 121 are vertically moved by driving the lifting mechanism 124.

A flange 125 is disposed at a portion of the support column 123 outside the housing 100. A bellows 126 is disposed between the flange 125 and the portion where the support column 123 penetrates through the bottom wall of the housing body 101 to surround an outer periphery of the support column 123. Accordingly, the housing 100 is maintained in an airtight state.

A gas exhaust port 101c is disposed on the bottom wall of the housing body 101. One end of a gas exhaust line 131 is connected to the gas exhaust port 101c. The other end of the gas exhaust line 131 is connected to a gas exhaust unit 132 including, for example, a vacuum pump. An automatic pressure controller (APC) valve 133 for controlling a pressure in the housing 100 is disposed at an upstream side of the gas exhaust line 131 compared to the gas exhaust unit 132. By providing the above mechanism for gas exhaust, the components vaporized from the wafer W during the above-described high-temperature heating process can be exhausted.

Further, on an inner peripheral surface of a sidewall of the housing body 101 below the loading/unloading port 101a, a convex portion 101d protruding toward the center of the housing 100 is formed. The convex portion 101d is formed in an annular shape extending along the circumferential direction. Hereinafter, the convex portion 101d will be referred to as "annular convex portion 101d."

The vertically movable valve body 141 serving as a partition member is disposed above the substrate support 110 in the housing 100. The valve body 141 is made of, e.g., stainless steel.

By vertically moving the valve body 141, the first space S1 and the second space S2 can be airtightly separated from a state where the first space S1 and the second space S2 in the housing 100 communicate with each other. Specifically, the valve body 141 is lowered and comes into contact with an upper surface of the annular convex portion 101d, so that the first space S1 and the second space S2 can be airtightly separated.

An O-ring 142 is preferably disposed on a contact surface between the valve body 141 and the annular convex portion 101d. The O-ring 142 is disposed, e.g., on the upper surface of the annular convex portion 101d. Alternatively, the O-ring 142 may be disposed on the bottom surface of the valve body 141 to be in contact with the annular convex portion 101d.

Connected to a central portion of an upper surface of the valve body 141 is a lower end of a support column 143 extending in the vertical direction. The support column 143 extends through the lid 102 through an opening 102a formed in the lid 102 of the housing 100, and an upper end of the support column 143 is connected to a driving mechanism 144. The driving mechanism 144 has, e.g., a motor or a ball screw, and the valve body 141 is moved vertically between an open position and a closed position by driving the driving mechanism 144. The open position indicates a position where the valve body 141 is positioned above the loading/unloading port 101a and the vacuum transfer chamber $31_2$ and the second space S2 communicate with each other through the loading/unloading port 101a. Further, the closed position indicates a position where the valve body 141 is in contact with the upper surface of the annular convex portion 101d and the first space S1 and the second space S2 are airtightly separated by the valve body 141.

A flange 145 is disposed at a portion of the support column 143 outside the housing 100. A bellows 146 is disposed between the flange 145 and the portion where the support column 143 penetrates through the lid 102 of the housing 100 to surround an outer periphery of the support column 143. Accordingly, the housing 100 is maintained in an airtight state.

A vertically movable shield member 151 that surrounds the substrate support 110 is disposed in the housing 100. The shield member 151 is formed in a box shape to surround substantially the entire substrate support 110 and has an inlet/outlet 151a for the wafer W. The shield member 151 is made of, for example, stainless steel.

When the first space S1 and the second space S2 are airtightly separated by the valve body 141, the substrate support 110 on which the wafer W is placed is surrounded by the shield member 151 to provide the following effects, for example.

(i) When the valve body 141 is moved from the closed position to the open position after the high-temperature heating process is performed on the wafer W using the substrate support 110, it is possible to suppress the inflow of the components vaporized from the wafer W in the second space S2 into the vacuum transfer chamber $31_2$.

(ii) Further, it is possible to prevent foreign substances generated by the contact between the valve body 141 and the annular convex portion 101d from adversely affecting the wafer W on the substrate support 110.

(iii) It is possible to suppress that the heat from the substrate support 110 affects the outside member such as the housing 100.

A bottom surface of an upper portion of the shield member 151 is preferably subjected to roughening treatment such as blasting treatment to easily absorb the components vaporized from the wafer W. In order to avoid deformation due to heat or the like, other portions of the shield member 151 are preferably subjected to polishing treatment such as electrolytic polishing treatment to reflect the heat.

The inlet/outlet 151a is used when the wafer W is transferred between the support pins 121 and the transfer arm $51_2$ of the wafer transfer mechanism $50_2$ that enters the housing 100 through the loading/unloading port 101a.

In this example, the support plate 122 for supporting the support pins 121 serves as a bottom wall of the shield member 151. In other words, the shield member 151 and the support plate 122 are formed as one unit. Therefore, when the support pins 121 are vertically moved by driving the lifting mechanism 124, the shield member 151 is also vertically moved together with the support pins 121. In other words, the shield member 151 is driven by the lifting mechanism 124 for vertically moving the support pins 121.

Further, when the first space S1 and the second space S2 are airtightly separated by the valve body 141, an upper end 151b of the inlet/outlet 151a of the shield member 151 is positioned lower than an upper end 112a of the outer peripheral portion of the cover member 112 provided at the substrate support 110 as shown in FIG. 3. Accordingly, the cover member 112 can be used to prevent foreign substances generated by the contact between the valve body 141 and the annular convex portion 101d from entering the shield member 151 through the inlet/outlet 151a. In addition, a lower end 151c of the inlet/outlet 151a of the shield member 151 is positioned higher than a lower end 112b of the outer peripheral portion of the cover member 112, so that the inlet/outlet 151a of the shield member 151 may be blocked by the cover member 112 when seen from the side.

Further, it is preferred that the upper end 151b of the inlet/outlet 151a of the shield member 151 is positioned lower than an upper surface of the wafer W on the substrate support 110.

The structure of each of the temperature control chambers $32_1$, $32_3$, and $32_6$ is similar to that of the temperature control chamber $32_2$, so that the description thereof will be omitted. However, in the temperature control chamber $32_1$ where the low-temperature cooling process is performed instead of the high-temperature heating process, a cooling mechanism is provided, instead of the heating mechanism 111, to cool the wafer W to a desired temperature lower than the room temperature or to maintain the wafer W at the room temperature. The cooling mechanism may be a flow channel of a coolant having a temperature lower than 0° C. In the temperature control chamber $32_6$ where the room-temperature process is performed instead of the high-temperature heating process, a cooling mechanism for cooling the wafer W to the room temperature is provided instead of the heating mechanism 111. The cooling mechanism may be a flow channel of cooling water. In the temperature control chamber $32_1$ and the temperature control chamber $32_6$, the members related to the gas exhaust operation such as the gas exhaust port 101c and the gas exhaust unit 132, or the members for separating the first space S1 and the second space S2 such as the valve body 141, and the shield member 151 may be omitted.

Next, the relay chamber $32_5$ will be described.

Figure 4:
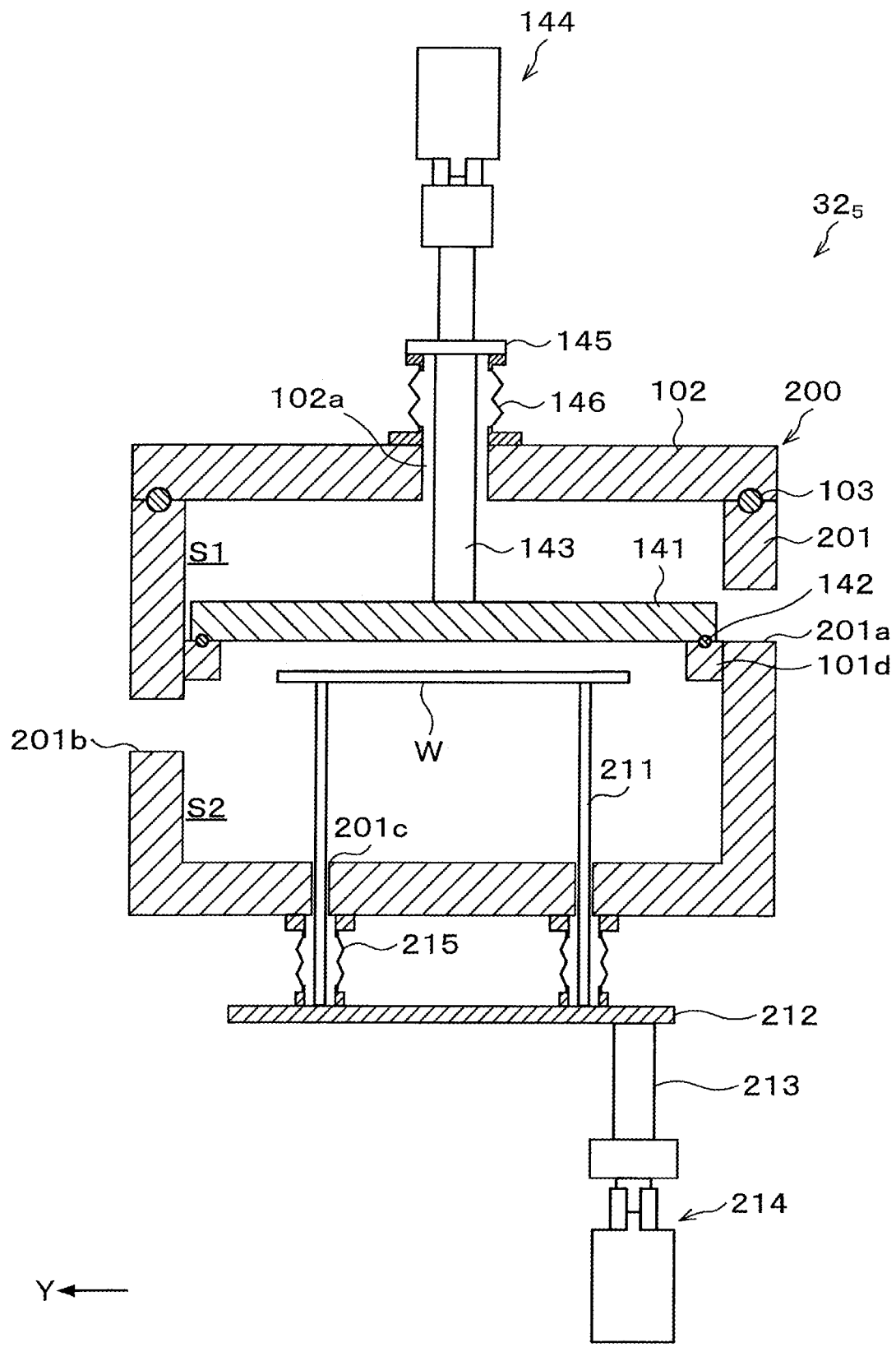
FIG. 4 is a vertical cross-sectional view of a relay chamber.

FIG. 4 is a vertical cross-sectional view of the relay chamber $32_5$.

As shown in FIG. 4, unlike the temperature control chamber $32_2$, the relay chamber $32_5$ does not include the members related to the gas exhaust operation such as the gas exhaust unit 132, the members related to the substrate support 110, and the shield member 151.

In a housing body 201 of a housing 200 of the relay chamber $32_5$, similar to the housing body 101 of the temperature control chamber $32_2$, a loading/unloading port 201a for loading and unloading the wafer W into and from the adjacent vacuum transfer chamber $31_2$ is formed on a sidewall of a front side of the housing body 201 (negative side of the Y direction in FIG. 4). Further, in the housing body 201 of the relay chamber $32_5$, unlike the housing body 101 of the temperature control chamber $32_2$, a loading/unloading port 201b for loading and unloading the wafer W into and from the adjacent vacuum transfer chamber $31_3$ is additionally formed on a sidewall of a rear side of the housing body 201 (positive side of the Y direction in FIG. 4). An inner space of the housing 200 of the relay chamber $32_5$ and an inner space of the vacuum transfer chamber $31_3$ communicate with each other through the loading/unloading port 201b.

Further, the loading/unloading port 201a is formed on the first space S1 side of the housing 200, whereas the loading/ unloading port 201b is formed on the second space S2 side of the housing 200. In other words, the loading/unloading port 201a and the loading/unloading port 201b are formed at different height positions. The loading/unloading port 201a is formed above the annular convex portion 101d of the housing body 201, whereas the loading/unloading port 201b is formed below the annular convex portion 101d of the housing body 201.

While the support pins 121 disposed in the temperature control chamber $32_2$ are used to transfer the wafer W between the substrate support 110 and the transfer arm $51_2$ of the wafer transfer mechanism $50_2$ in the vacuum transfer chamber $31_2$, support pins 211 disposed in the relay chamber $32_5$ are used to transfer the wafer W between the transfer arm $51_2$ of the wafer transfer mechanism $50_2$ in the vacuum transfer chamber $31_2$ and a transfer arm $51_3$ of a wafer transfer mechanism $50_3$ in the vacuum transfer chamber $31_3$.

In the relay chamber $32_5$, the support pins 211 extend toward the outside of the housing 200 through the opening 201c formed in a bottom wall of the housing body 201. The support pins 211 are connected to an upper surface of a support member 212. An upper end of a support column 213 vertically extending is connected to a bottom surface of the support member 212. A lower end of the support column 213 is connected to a lifting mechanism 214 serving as a pin driving mechanism. The lifting mechanism 214 has, for example, a motor or a ball screw, and the support pins 211 are vertically moved by driving the lifting mechanism 214.

Bellows 215 are disposed between the support member 212 and the portions where the support pins 211 penetrate through the bottom wall of the housing body 201 to thereby surround the outer peripheries of the support pins 211. Accordingly, the housing 200 is maintained in an airtight state.

Since the structure of the relay chamber $32_4$ is similar to that of the relay chamber $32_5$, the description thereof will be omitted.

Further, the vacuum transfer chamber 31 has multiple openings for the vacuum processing chamber 40 or the load-lock chamber 12, and these openings are formed at the same height position as the loading/unloading port 201b. The height positions of these openings and the loading/unloading port 201b are different from those of the loading/unloading ports 101a and 201a. In order to cope with the difference in the height positions, the wafer transfer mechanism 50 in each vacuum transfer chamber 31 is provided with the lifter 52 as described above.

Next, the wafer treatment using the processing system 1 configured as described above will be described with reference to FIGS. 5 to 13. FIGS. 5 to 13 show states of the wafer accommodating chamber 32 during the wafer treatment.

First, a cassette C containing a plurality of wafers W is loaded into the cassette station 10 of the processing system 1 and placed on the cassette mounting table 20. Then, a wafer transfer mechanism (not shown) of the atmospheric pressure transfer apparatus 21 extracts one wafer W from the cassette C. The gate valve G1 is opened and the wafer W is loaded into the load-lock chamber 12. When the wafer W is loaded into the load-lock chamber 12, the gate valve G1 is closed and the load-lock chamber 12 is sealed and the pressure in the load-lock chamber 12 is reduced. Next, the gate valve G2 is opened, and the load-lock chamber 12 and the vacuum transfer chamber $31_1$ maintained in the vacuum atmosphere communicate with each other. Thereafter, the wafer W is unloaded from the load-lock chamber 12 and loaded into the vacuum transfer chamber $31_1$ by a transfer arm $51_1$ of a wafer transfer mechanism $50_1$.

Next, the gate valve G2 is closed and the gate valve G11 is opened, so that the vacuum transfer chamber $31_1$ and the vacuum processing chamber $40_1$ communicate with each other. Then, the wafer W is placed on the substrate support 41 in the vacuum processing chamber $40_1$ by the transfer arm $51_1$ of the wafer transfer mechanism $50_1$ and a wafer lifting mechanism (not shown) in the vacuum processing chamber $40_1$.

A degas chamber (not shown) for heating and degassing the wafer W may be disposed in the vacuum transfer chamber $31_1$, so that the degas process may be performed on the wafer W in the degas chamber before the loading of the wafer W into the vacuum processing chamber $40_1$.

After the wafer W is placed on the substrate support 41, the gate valve G11 is closed and the vacuum processing chamber $40_1$ is sealed. Then, film formation is performed on the wafer W in the vacuum processing chamber $40_1$. Accordingly, an electrode layer or a base layer is formed on the wafer W, for example.

When the treatment in the vacuum processing chamber $40_1$ is completed, the gate valve G11 is opened, and the vacuum processing chamber $40_1$ and the vacuum transfer chamber $31_1$ communicate with each other. Then, the wafer W is unloaded from the vacuum processing chamber $40_1$ and loaded into the vacuum transfer chamber $31_1$ by the transfer arm $51_1$ of the wafer transfer mechanism $50_1$. Then, the gate valve G11 is closed.

Figure 5:
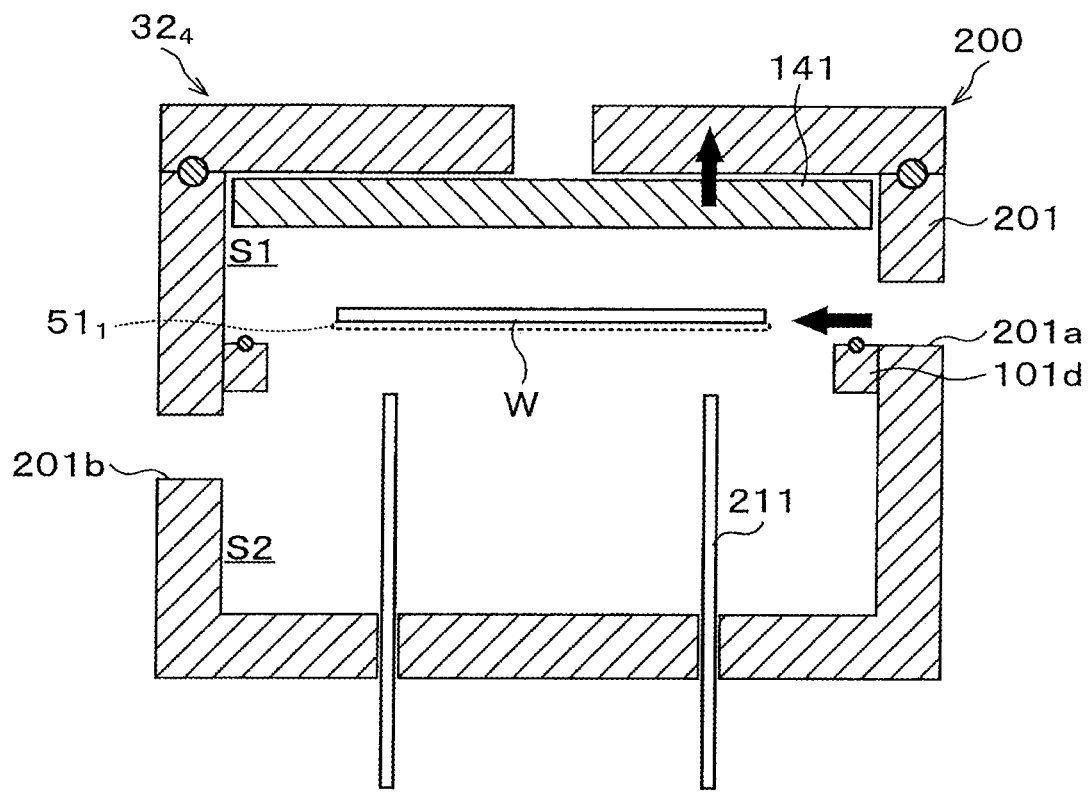
FIGS. 5 to 16 show states of the wafer accommodating chambers during wafer treatment to explain the wafer treatment using the processing system of FIG. 1.
Figure 6:
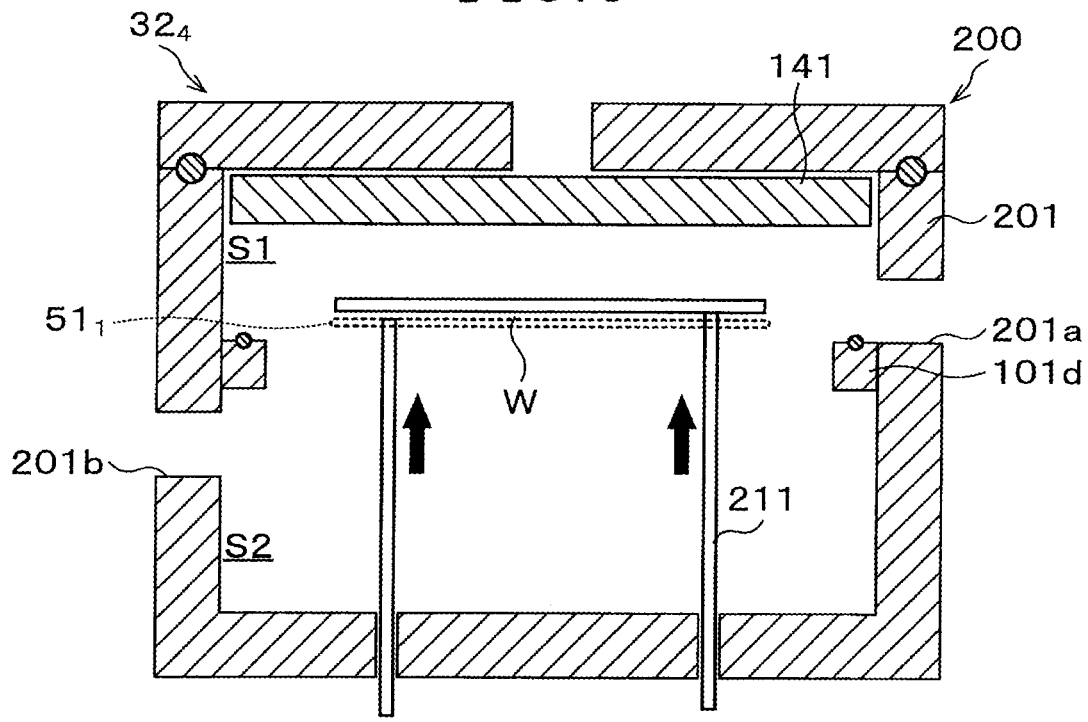
Figure 7:
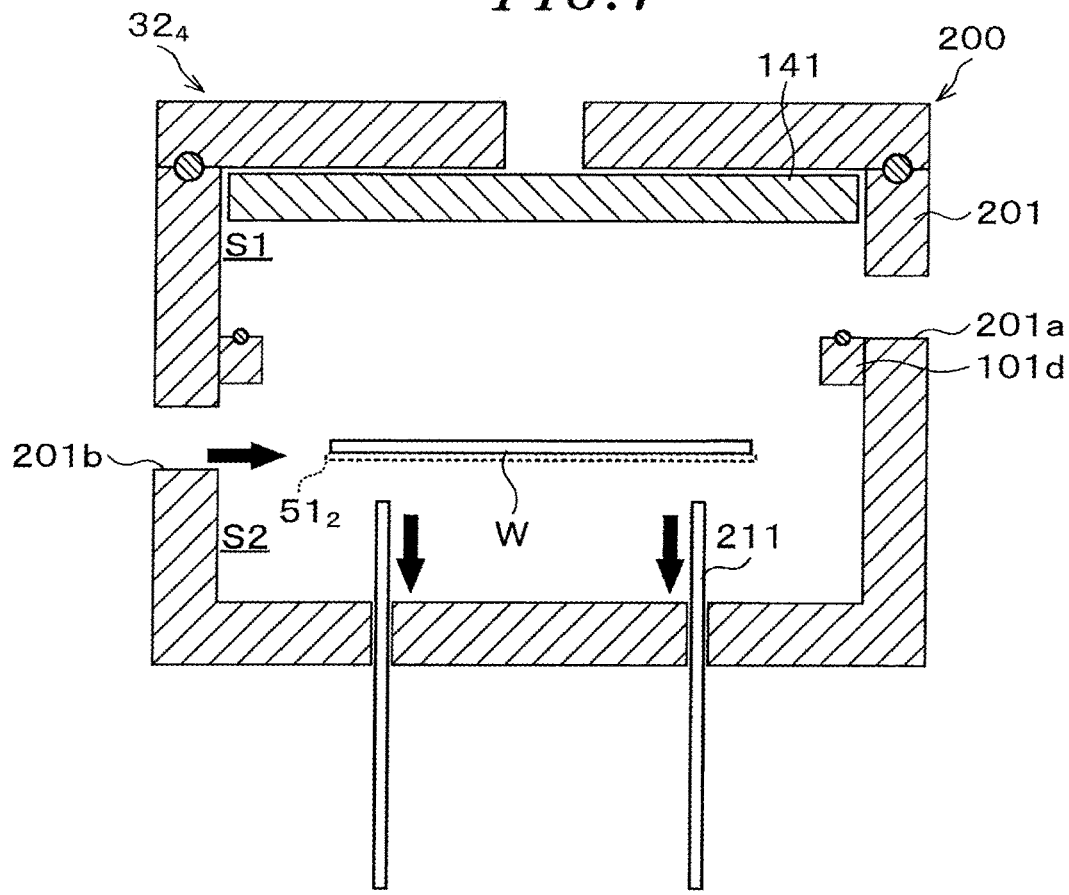

Next, the wafer W is unloaded from the vacuum transfer chamber $31_1$ and loaded into the vacuum transfer chamber $31_2$ through the relay chamber $32_4$. Specifically, as shown in FIG. 5, the valve body 141 in the relay chamber $32_4$ is raised from the closed position to the open position by driving the driving mechanism 144. Accordingly, the vacuum transfer chamber $31_1$ and the vacuum transfer chamber $31_2$ communicate with each other through the relay chamber $32_4$. Then, the transfer arm $51_1$ holding the wafer W in the vacuum transfer chamber $31_1$ enters the housing 200 of the relay chamber $32_4$ through the loading/unloading port 201a to reach a position above the support pins 211. Next, as shown in FIG. 6, the support pins 211 are raised by driving the lifting mechanism 214, and the wafer W is transferred onto the support pins 211. Then, the transfer arm $51_1$ is retracted from the housing 200. Next, as shown in FIG. 7, the transfer arm $51_2$ in the vacuum transfer chamber $31_2$ enters the housing 200 of the relay chamber $32_4$ through the loading/unloading port 201b to reach a position below the wafer W supported by the support pins 211. At the same time, the support pins 211 are lowered by driving the lifting mechanism 214, and the wafer W is transferred from the support pins 211 to the transfer arm $51_2$ and reaches the height position of the loading/unloading port 201b of the housing 200. Then, the transfer arm $51_2$ is retracted from the housing 200, and the wafer W is loaded into the vacuum transfer chamber $31_2$. When the transfer arm $51_2$ is retracted from the housing 200, the valve body 141 is lowered and reaches the closed position.

After the wafer W is loaded into the vacuum transfer chamber $31_2$, the gate valve G12 is opened and the vacuum transfer chamber $31_2$ and the vacuum processing chamber $40_2$ communicate with each other. Then, the wafer W is placed on the substrate support 41 in the vacuum processing chamber $40_2$ by the transfer arm $51_2$ of the wafer transfer mechanism $50_2$ and a wafer lifting mechanism (not shown) in the vacuum processing chamber $40_2$.

After the wafer W is placed, the gate valve G12 is closed and the vacuum processing chamber $40_2$ is sealed. Then, film formation is performed on the wafer W in the vacuum processing chamber $40_2$. Accordingly, a fixed layer of a magnetoresistive element is formed on the wafer W, for example.

When the treatment in the vacuum processing chamber $40_2$ is completed, the gate valve G12 is opened and the vacuum processing chamber $40_2$ and the vacuum transfer chamber $31_2$ communicate with each other. Then, the wafer W is unloaded from the vacuum processing chamber $40_2$ and loaded into the vacuum transfer chamber $31_2$ by the transfer arm $51_2$ of the wafer transfer mechanism $50_2$.

Then, the gate valve G14 is closed. Then, as in the case of loading the wafer W from the vacuum transfer chamber $31_1$ into the vacuum transfer chamber $31_2$ through the relay chamber $32_4$, the wafer W is loaded from the vacuum transfer chamber $31_2$ to the vacuum transfer chamber $31_3$ through the relay chamber $32_5$.

Next, the gate valve G13 is opened, and the vacuum transfer chamber $31_3$ and the vacuum processing chamber $40_3$ communicate with each other. Then, the wafer W is placed on the substrate support 41 in the vacuum processing chamber $40_3$ by the transfer arm $51_3$ of the wafer transfer mechanism $50_3$ and a wafer lifting mechanism (not shown) in the vacuum processing chamber $40_3$.

After the wafer W is placed, the gate valve G13 is closed and the vacuum processing chamber $40_3$ is sealed. Then, film formation is performed on the wafer W in the vacuum processing chamber $40_3$. Accordingly, a reference layer is formed on the wafer W, for example.

When the treatment in the vacuum processing chamber $40_3$ is completed, the gate valve G13 is opened and the vacuum processing chamber $40_3$ and the vacuum transfer chamber $31_3$ communicate with each other. Then, the wafer W is unloaded from the vacuum processing chamber $40_3$ and loaded into the vacuum transfer chamber $31_3$ by the transfer arm $51_3$ of the wafer transfer mechanism $50_3$.

Next, the gate valve G13 is closed and the gate valve G14 is opened, so that the vacuum transfer chamber $31_3$ and the vacuum processing chamber $40_4$ communicate with other. Then, the wafer W is placed on the substrate support 41 in the vacuum processing chamber $40_4$ by the transfer arm $51_3$ of the wafer transfer mechanism $50_3$ and a wafer lifting mechanism (not shown) in the vacuum processing chamber $40_4$.

After the wafer W is placed, the gate valve G14 is closed and the vacuum processing chamber $40_4$ is sealed. Then, film formation is performed on the wafer W in the vacuum processing chamber $40_4$. Accordingly, a barrier layer is formed on the wafer W, for example.

When the treatment in the vacuum processing chamber $40_4$ is completed, the gate valve G14 is opened and the vacuum processing chamber $40_4$ and the vacuum transfer chamber $31_3$ communicate with each other. Then, the wafer W is unloaded from the vacuum processing chamber $40_4$ and loaded into the vacuum transfer chamber $31_3$ by the transfer arm $51_3$ of the wafer transfer mechanism $50_3$.

Figure 8:
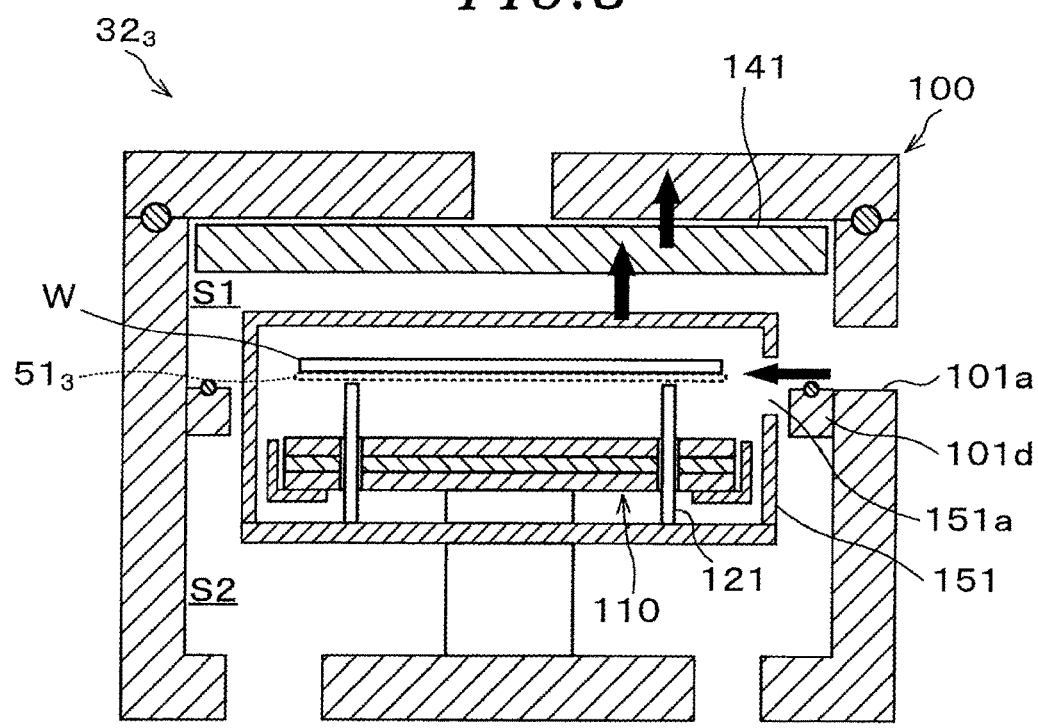
Figure 9:
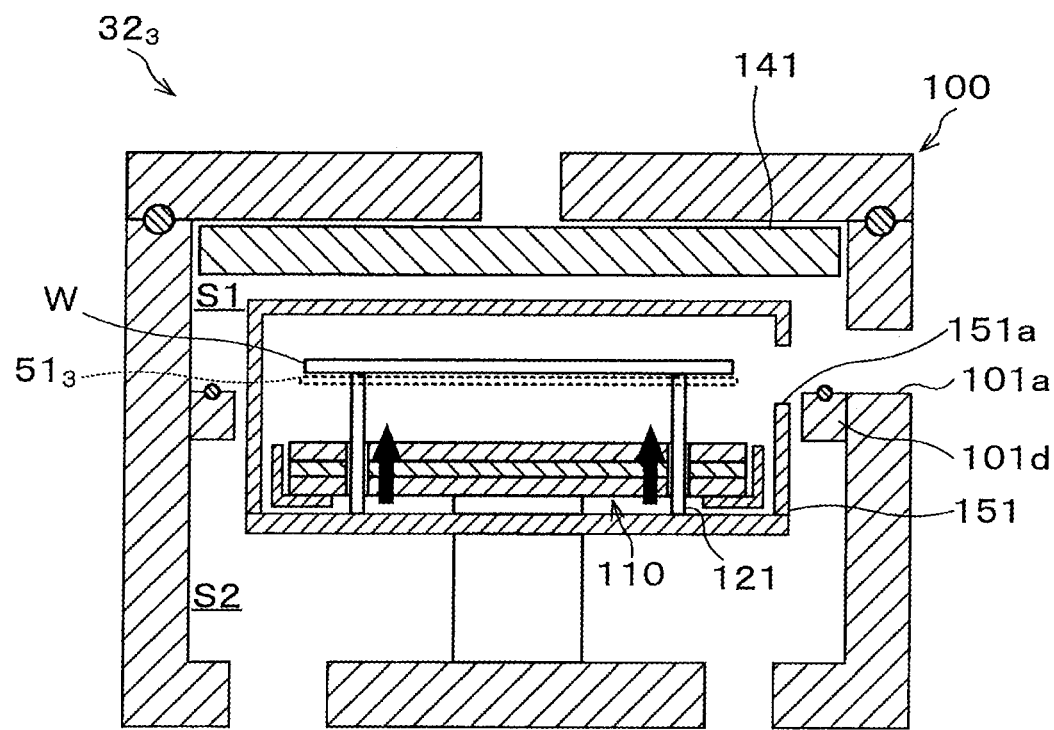

Next, the gate valve G14 is closed. Then, the wafer W is unloaded from the vacuum transfer chamber $31_3$ and loaded into the temperature control chamber $32_3$. Specifically, as shown in FIG. 8, the valve body 141 in the temperature control chamber $32_3$ is raised from the closed position to the open position by driving the driving mechanism 144. Accordingly, the vacuum transfer chamber $31_3$ and the second space S2 where the substrate support 110 in the housing 100 of the temperature control chamber $32_3$ is disposed communicate with each other through the loading/unloading port 101a. Further, the shield member 151 (and the support pins 121) is also raised by driving the lifting mechanism 124 until the height position of the inlet/outlet 151a of the shield member 151 becomes substantially the same as that of the loading/unloading port 101a. Then, the transfer arm $51_3$ holding the wafer W in the vacuum transfer chamber $31_3$ enters the housing 100 through the loading/unloading port 101a to reach a position above the substrate support 110 in the shield member 151 through the inlet/outlet 151a. Next, as shown in FIG. 9, the support pins 121 (and the shield member 151) are raised by driving the lifting mechanism 124, and the wafer W is transferred onto the support pins 121 protruding from the upper surface of the substrate support 110.

Figure 10:
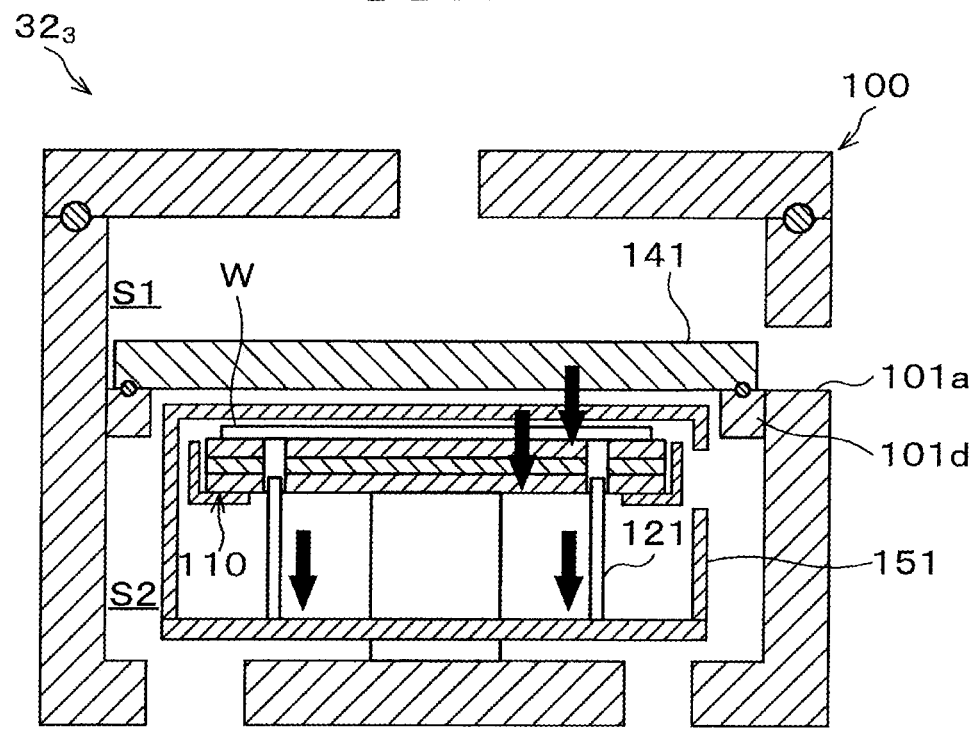

Then, the transfer arm $51_3$ is retracted from the shield member 151 and the housing 100. Then, as shown in FIG. 10, the support pins 121 are lowered by driving the lifting mechanism 124, and the wafer W on the support pins 121 is placed on the substrate support 110 pre-heated to a high temperature. As the support pins 121 are lowered, the shield member 151 is also lowered until it reaches the second space S2 in the housing 100. As the support pins 121 and the shield member 151 are lowered, the valve pin 141 is also lowered by the driving mechanism 144 and reaches the closed position. Accordingly, in the housing 100, the second space S2 where the substrate support 110 and the wafer W placed on the substrate support 110 are disposed and the first space S1 communicating with the vacuum transfer chamber $31_3$ through the loading/unloading port 101a are airtightly separated by the valve body 141.

In this state, the wafer W is subjected to the high-temperature heating process using the substrate support 110. The high-temperature heating process is performed until a pressure in the second space S2 of the housing 100 detected by a pressure sensor (not shown) becomes lower than or equal to a predetermined pressure. The film quality is improved by the high-temperature heating process.

When the high-temperature heating process is completed, the wafer W is unloaded from the temperature control chamber $32_3$ in the reverse order of the loading of the wafer W and loaded into the vacuum transfer chamber $31_3$.

Then, the wafer W is loaded from the vacuum transfer chamber $31_3$ to the temperature control chamber $32_6$ in the same order of the loading of the wafer W from the vacuum transfer chamber $31_3$ to the temperature control chamber $32_3$. Next, the wafer W is placed on the substrate support 110 in the temperature control chamber $32_6$, and the room-temperature process is performed. Therefore, the wafer W is returned to the room temperature, and a rapid temperature change of the wafer W at the time of proceeding to a next step can be suppressed. Accordingly, the damage to the wafer W or the substrate support in the next step can be suppressed. The room-temperature process is completed, for example, when a predetermined period of time elapses after the wafer W is placed on the substrate support 110.

After the room-temperature process is completed, the wafer W is unloaded from the temperature control chamber $32_6$ to the vacuum transfer chamber $31_3$ in the same order of the unloading of the wafer W from the temperature control chamber $32_3$ to the vacuum transfer chamber $31_3$. After the wafer W is unloaded, the valve body 141 in the temperature control chamber $32_6$ is lowered and reaches the closed position.

Figure 11:
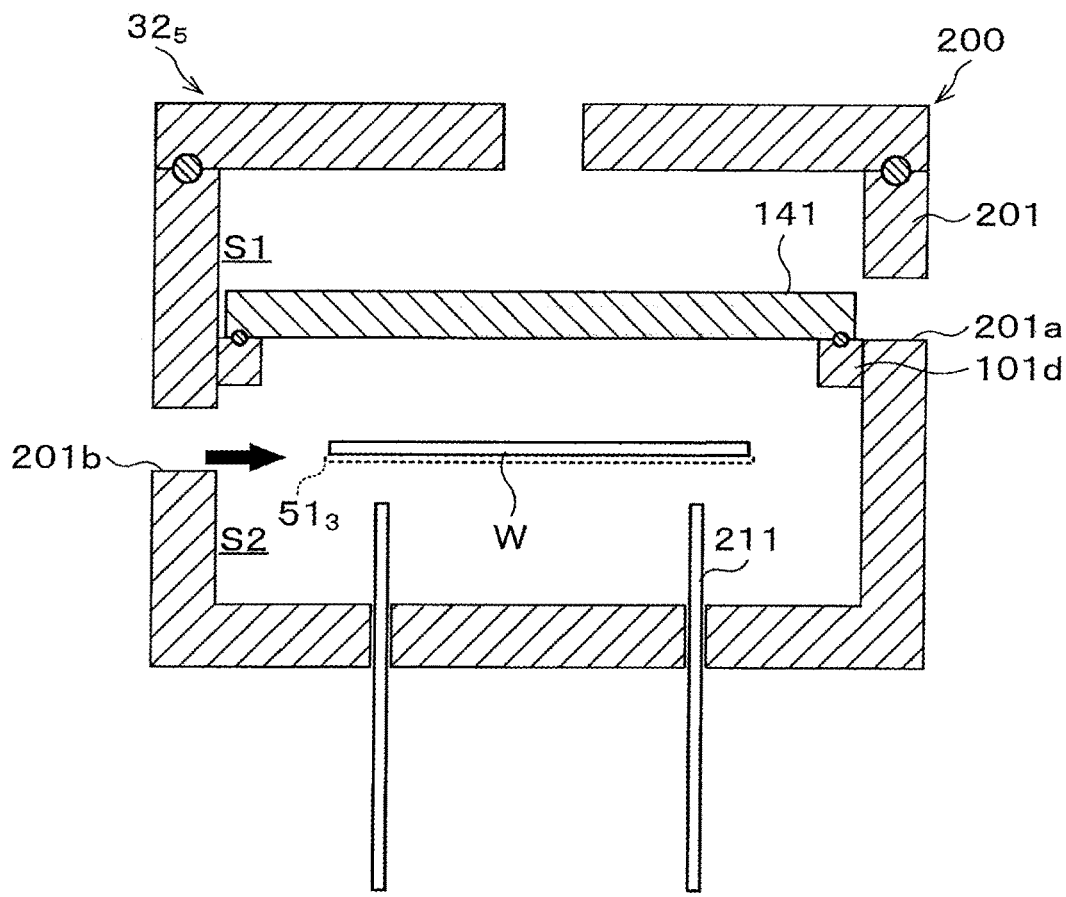
Figure 12:
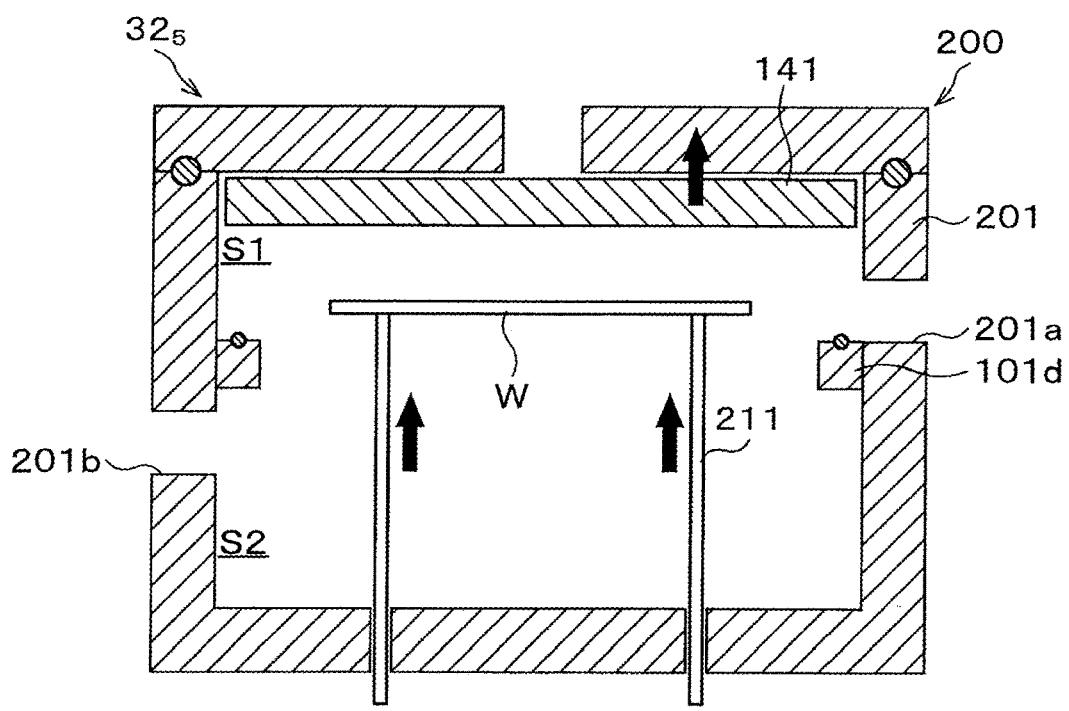
Figure 13:
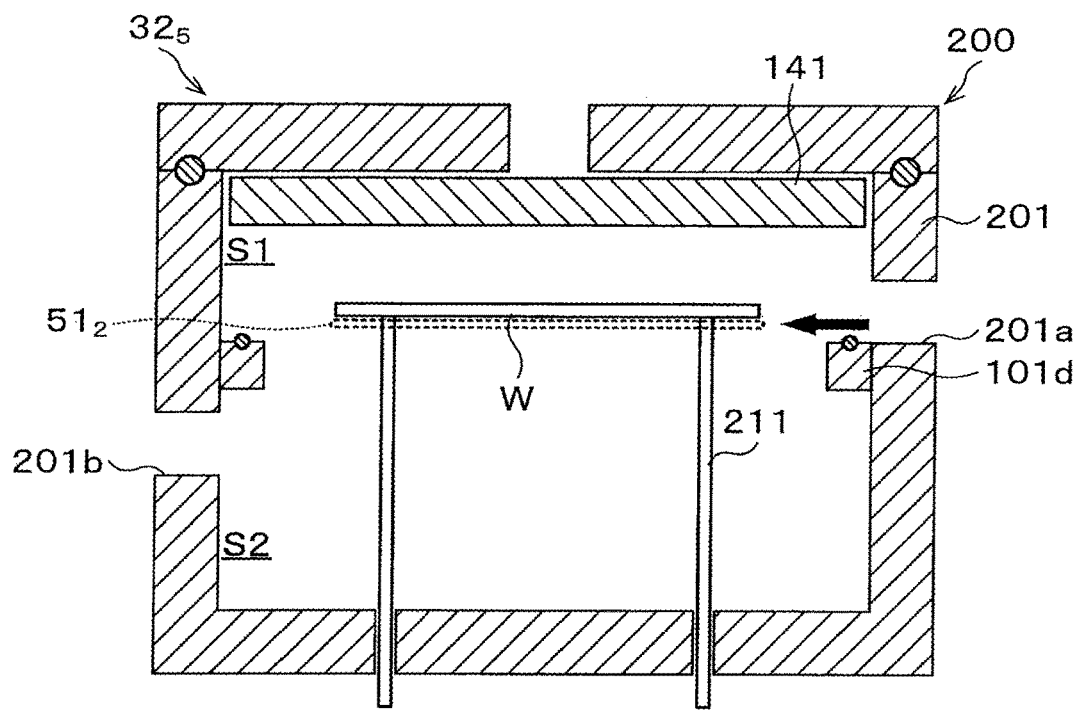
Figure 14:
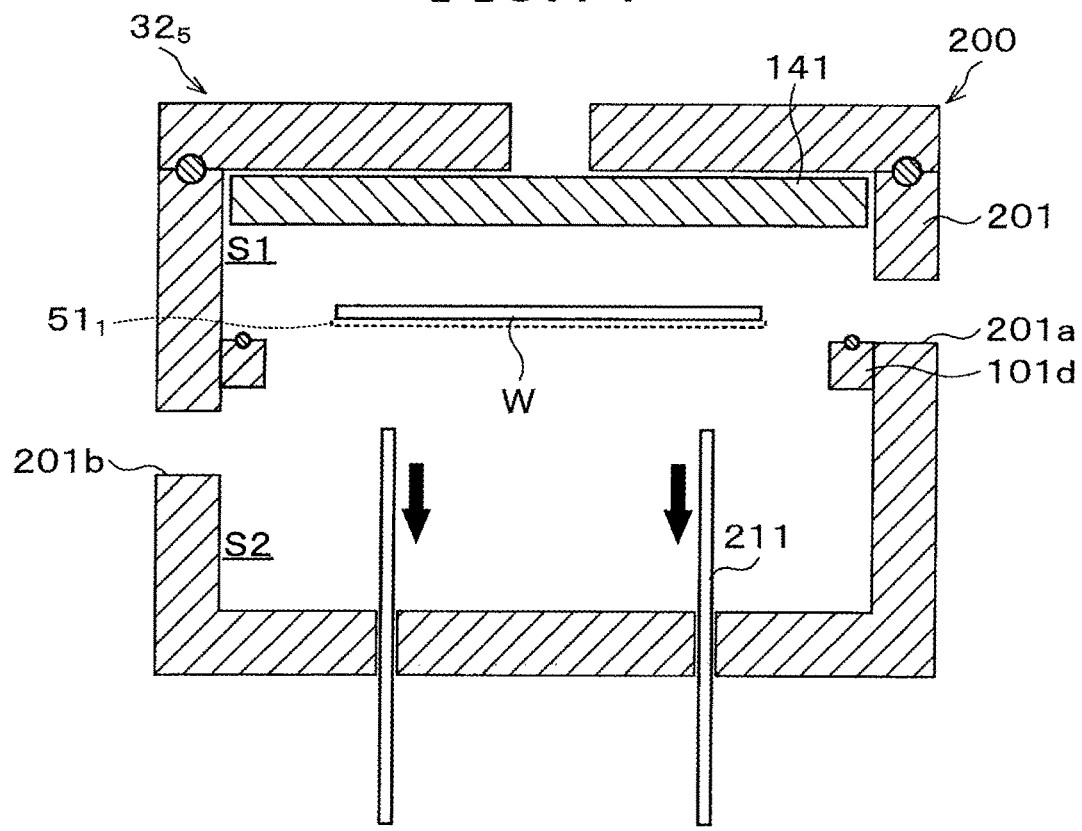

Next, the wafer W is unloaded from the vacuum transfer chamber $31_3$ and loaded into the vacuum transfer chamber $31_2$ through the relay chamber $32_5$. Specifically, as shown in FIG. 11, the transfer arm $51_3$ holding the wafer W in the vacuum transfer chamber $31_3$ enters the housing 200 of the relay chamber $32_5$ through the loading/unloading port 201b to reach a position above the support pins 211. Next, as shown in FIG. 12, the valve body 141 is raised by driving the driving mechanism 144 from the closed position to the open position. Accordingly, the vacuum transfer chamber $31_3$ and the vacuum transfer chamber $31_2$ communicate with each other through the relay chamber $32_5$. Further, the support pins 211 are raised by driving the lifting mechanism 214, and the wafer W is transferred onto the support pins 211 and reaches the height position of the loading/unloading port 201a of the housing 200. When the support pins 211 are raised, the transfer arm $51_3$ is retracted from the housing 200. Next, as shown in FIG. 13, the transfer arm $51_2$ in the vacuum transfer chamber $31_2$ enters the housing 200 of the relay chamber $32_5$ through the loading/unloading port 201a to reach a position below the wafer W supported by the support pins 211. Then, as shown in FIG. 14, the support pins 211 are lowered by driving the lifting mechanism 214, and the wafer W is transferred from the support pins 211 to the transfer arm $51_2$. Thereafter, the transfer arm $51_2$ is retracted from the housing 200, and the wafer W is loaded into the vacuum transfer chamber $31_2$. When the transfer arm $51_2$ is retracted from the housing 200, the valve body 141 is lowered and reaches the closed position.

Then, the gate valve G15 is opened, and the vacuum transfer chamber $31_2$ and the vacuum processing chamber $40_5$ communicate with each other. Then, the wafer W is placed on the substrate support 41 in the vacuum processing chamber $40_5$ by the transfer arm $51_2$ of the wafer transfer mechanism $50_2$ and a wafer lifting mechanism (not shown) in the vacuum processing chamber $40_5$.

After the wafer W is placed, the gate valve G15 is closed and the vacuum processing chamber $40_5$ is sealed. Then, film formation is performed on the wafer W in the vacuum processing chamber $40_5$. Accordingly, a free layer is formed on the wafer W, for example.

When the treatment in the vacuum processing chamber $40_5$ is completed, the gate valve G15 is opened and the vacuum processing chamber $40_5$ and the vacuum transfer chamber $31_2$ communicate with each other. Then, the wafer W is unloaded from the vacuum processing chamber $40_5$ and loaded into the vacuum transfer chamber $31_2$ by the transfer arm $51_2$ of the wafer transfer mechanism $50_2$.

Figure 15:
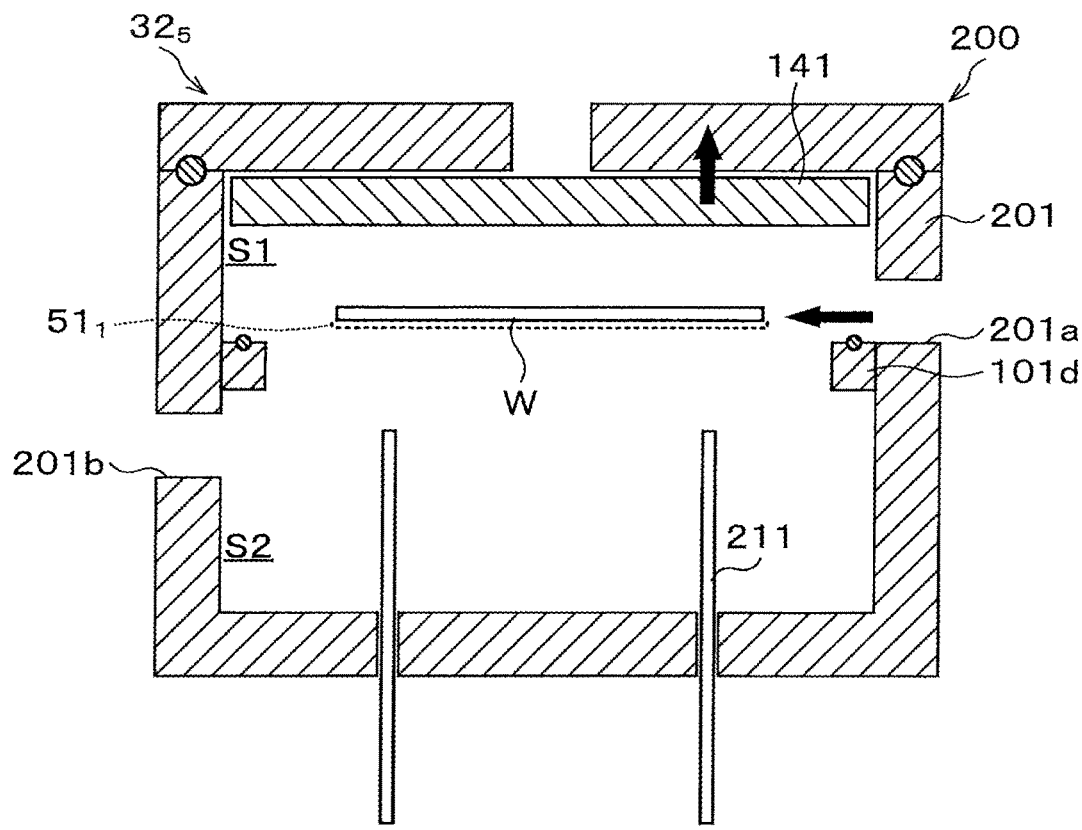
Figure 16:
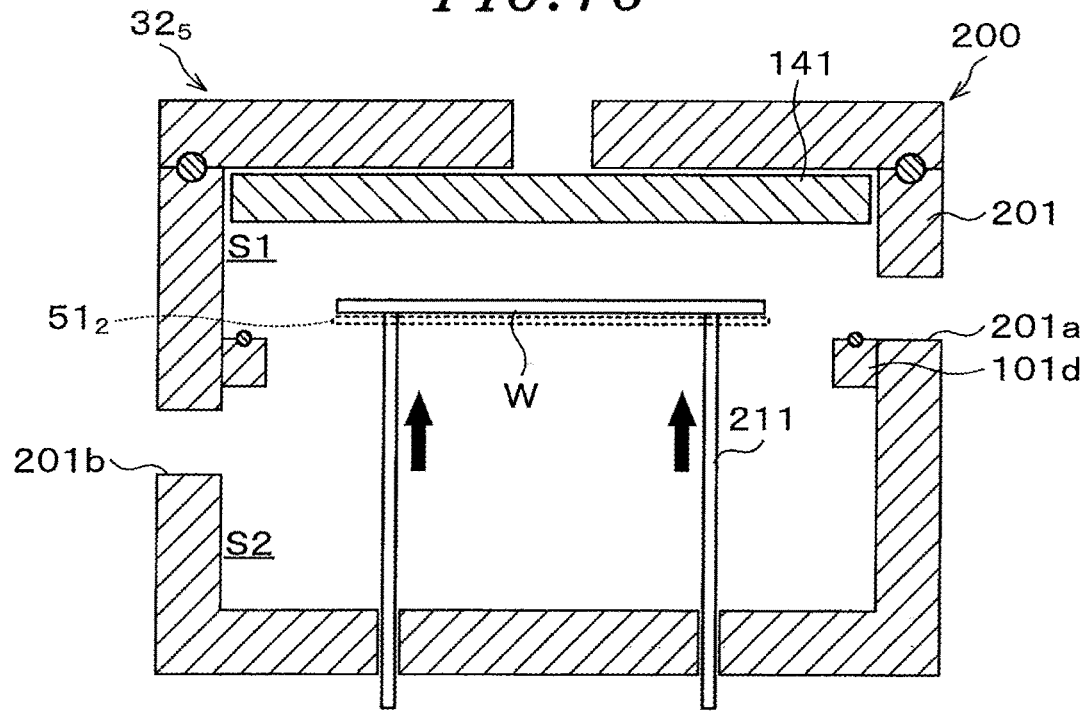

Next, the gate valve G15 is closed. Then, the wafer W is unloaded from the vacuum transfer chamber $31_2$ and loaded into the relay chamber $32_5$. Specifically, as shown in FIG. 15, the valve body 141 in the relay chamber $32_5$ is raised by driving the driving mechanism 144 from the closed position to the open position. Thereafter, the transfer arm $51_2$ holding the wafer W in the vacuum transfer chamber $31_2$ enters the housing 200 of the relay chamber $32_5$ through the loading/unloading port 201a to reach a position above the support pins 211. Next, as shown in FIG. 16, the support pins 211 are raised by driving the lifting mechanism 214, and the wafer W is transferred onto the support pins 211. Then, the transfer arm $51_2$ is retracted from the housing 200.

The wafer W is maintained in this state for a predetermined period of time. Accordingly, the wafer W is returned to the room temperature. In order to return the wafer W to the room temperature in the relay chamber $32_5$, similar to the temperature control chamber $32_6$, a substrate support for the wafer W may includes a temperature control mechanism and may be disposed in the relay chamber $32_5$.

After the wafer W is returned to the room temperature, the wafer W is unloaded from the relay chamber $32_5$ in the reverse order of the loading of the wafer W and loaded into the vacuum transfer chamber $31_2$. After the wafer W is unloaded, the valve body 141 in the relay chamber $32_5$ is lowered and reaches the closed position.

Then, the wafer W is loaded from the vacuum transfer chamber $31_2$ to the temperature control chamber $32_2$ in the same order to the loading of the wafer W from the vacuum transfer chamber $31_3$ to the temperature control chamber $32_3$. Then, the wafer W is placed on the substrate support 110 in the temperature control chamber $32_2$ pre-heated to a high temperature.

Similar to the heating process performed in the temperature control chamber $32_3$, for example, the high-temperature heating process is performed on the wafer W using the substrate support 110 in the temperature control chamber $32_2$ until a pressure in the second space S2 of the housing 100 detected by a pressure sensor (not shown) becomes lower than or equal to a predetermined pressure. The film quality is improved by the high-temperature heating process.

When the high-temperature heating process is completed, the wafer W is unloaded from the temperature control chamber $32_2$ to the vacuum transfer chamber $31_2$ in the same order of the unloading of the wafer W from the temperature control chamber $32_3$ to the vacuum transfer chamber $31_3$.

Then, the wafer W is loaded from the vacuum transfer chamber $31_2$ into the vacuum transfer chamber $31_1$ through the relay chamber $32_4$ in the same order of the loading of the wafer W from the vacuum transfer chamber $31_3$ into the vacuum transfer chamber $31_2$ through the relay chamber $32_5$.

Next, as in the case of loading the wafer W from the vacuum transfer chamber $31_3$ to the temperature control chamber $32_3$, the wafer W is loaded from the vacuum transfer chamber $31_1$ to the temperature control chamber $32_1$ in the same order of the loading of the wafer W from the vacuum transfer chamber $31_3$ to the temperature control chamber $32_3$. Then, the wafer W is placed for a predetermined period of time on the substrate support 110 pre-cooled to a temperature lower than the room temperature in the temperature control chamber $32_1$. Accordingly, the low-temperature cooling process is performed on the wafer W, and the film quality can be stabilized.

When the cooling process is completed, the wafer W is unloaded from the temperature control chamber $32_1$ to the vacuum transfer chamber $31_1$ in the same order of the unloading of the wafer W from the temperature control chamber $32_3$ to the vacuum transfer chamber $31_3$.

Next, the gate valve G16 is opened, and the vacuum transfer chamber $31_1$ and the vacuum processing chamber $40_6$ communicate with each other. Then, the wafer W is placed on the substrate support 41 in the vacuum processing chamber $40_6$ by the transfer arm $51_1$ of the wafer transfer mechanism $50_1$ and a wafer lifting mechanism (not shown) in the vacuum processing chamber $40_6$. After the wafer W is placed, the gate valve G16 is closed and the vacuum processing chamber $40_6$ is sealed. Then, film formation is performed on the wafer W in the vacuum processing chamber $40_6$. Accordingly, a cap layer or an electrode layer is formed on the wafer W, for example.

When the treatment in the vacuum processing chamber $40_6$ is completed, the gate valve G16 is opened and the vacuum processing chamber $40_6$ and the vacuum transfer chamber $31_1$ communicate with each other. Then, the wafer W is unloaded from the vacuum processing chamber $40_6$ and loaded into the vacuum transfer chamber $31_1$ by the transfer arm $51_1$ of the wafer transfer mechanism $50_1$.

Then, the wafer W is returned to the original cassette C through the load-lock chamber 12 in the reverse order of the loading of the wafer W from the cassette C.

The cooling process in the temperature control chamber $32_1$ may not be necessary. In this case, the wafer W is transferred from the vacuum transfer chamber $31_1$ to the vacuum processing chamber $40_6$ without passing through the temperature control chamber $32_1$.

Next, a maintenance method for the vacuum transfer chamber $31_1$ in the processing system 1 will be described.

During the maintenance of the vacuum transfer chamber $31_1$, the valve body 141 of the relay chamber $32_4$ adjacent to the vacuum transfer chamber $31_1$ is vertically moved in advance by driving the driving mechanism 144. Specifically, the valve body 141 is lowered from the open position to the closed position. Accordingly, the first space S1 communicating with the vacuum transfer chamber $31_1$ through the loading/unloading port 201a of the relay chamber $32_4$ and the second space S2 communicating with the vacuum transfer chamber $31_2$ through the loading/unloading port 201b of the relay chamber $32_4$ are airtightly separated.

In this state, the lid (not shown) of the vacuum transfer chamber $31_1$ communicating with the first space S1 is opened, so that the inside of the vacuum transfer chamber $31_1$ is opened to the atmosphere. At this time, since the first space S1 and the second space S2 of the relay chamber $32_4$ are airtightly separated as described above, the inside of another vacuum transfer chamber $31_2$ adjacent to the vacuum transfer chamber $31_1$ is not opened to the atmosphere through the relay chamber $32_4$.

After the vacuum transfer chamber $31_1$ is opened to the atmosphere, a desired maintenance operation for the transfer arm $51_1$ or the like is performed in the vacuum transfer chamber $31_1$.

Then, the lid of the vacuum transfer chamber $31_1$ is closed to seal and evacuate the vacuum transfer chamber $31_1$.

When a pressure in the vacuum transfer chamber $31_1$ becomes lower than or equal to a predetermined pressure, the valve body 141 in the relay chamber $32_4$ can be raised to the open position by driving the driving mechanism 144.

As described above, in the present embodiment, in the vacuum transfer apparatus 30 in which the multiple vacuum transfer chambers 31, each having therein the wafer transfer mechanism 50 for holding and transferring the wafer W, are arranged consecutively, the wafer accommodating chambers 32 are disposed adjacent to the vacuum transfer chamber 31 in the arrangement direction of the vacuum transfer chambers 31. Further, the wafer accommodating chamber 32 includes the hollow housing 100 (200) having the loading/unloading port 101a (201a) for loading and unloading the wafer W into and from the vacuum transfer chamber 31 on one side wall in the arrangement direction of the vacuum transfer chambers 31; the vertically movable valve body 141 disposed in the housing 100 (200); and the driving mechanism 144 for vertically moving the valve body 141. The space in the housing 100 (200) is divided horizontally into the first space S1 where the loading/unloading port 101a (201a) is disposed (the loading/unloading port side) and the second space S2 where the loading/unloading port 101a (201a) is not disposed (the opposite side of the loading/unloading port side). In the wafer accommodating chamber 32, the valve body 141 is vertically moved, so that the first space S1 and the second space S2 are airtightly separated from a state where the first space S1 and the second space S2 communicate with each other. Therefore, the following effects (A) to (C) can be achieved.

(A) When one vacuum transfer chamber 31 and the vacuum processing chamber 40 adjacent thereto communicate with each other, a pressure change caused by the communication occurs only in the corresponding vacuum transfer chamber 31. Thus, it is possible to suppress that the pressure change affects other vacuum transfer chambers 31.

(B) During the maintenance, only one of the two vacuum transfer chambers 31 adjacent to the relay chambers $32_4$ ($32_5$) in the depth direction (the arrangement direction of the vacuum transfer chambers 31) is opened to the atmosphere, so that the maintenance time can be shortened compared to when both of the two vacuum transfer chambers 31 are opened to the atmosphere.

(C) The components vaporized from the wafer heated in the temperature control chamber $32_2$ for performing the high-temperature processing are prevented from flowing into the vacuum transfer chamber $31_2$ adjacent to the temperature control chamber $32_2$, which makes it possible to prevent those components from adversely affecting the wafer W transferred from and into the vacuum transfer chamber $31_2$.

Conventionally, in order to achieve the above effects (A) to (C), the gate valves are required between the vacuum transfer chambers 31 and the wafer accommodating chamber 32 adjacent to the vacuum transfer chambers 31 in the arrangement direction of the vacuum transfer chambers 31. The gate valves are disposed outside the wafer accommodating chambers 32 and are vertically moved at the outside of the wafer accommodating chambers 32. On the other hand, the valve bodies 141 are used in the present embodiment instead of the gate valves, and the valve bodies 141 are disposed inside the housings 100 and 200 of the wafer accommodating chambers 32 and are vertically moved inside the housings 100 and 200. Therefore, in the present embodiment, the downsizing of the vacuum transfer apparatus 30 including the wafer accommodating chambers 32 can be achieved by reducing the footprint thereof compared to the conventional case of using the gate valves. Further, the processing system 1 including the vacuum transfer apparatus 30 can also be downsized.

Further, in the present embodiment, the above-described gate valve is not provided for both of the wafer accommodating chambers 32 adjacent to each other in the width direction of the wafer accommodating chamber. However, the gate valve may be provided for only one of the wafer accommodating chambers 32 adjacent to each other in the width direction. In the configuration in which the gate valve is not provided for both of the wafer accommodating chambers 32 adjacent to each other in the width direction, the footprint can be reduced both in the depth direction (Y direction in FIG. 1) and in the width direction (X direction in FIG. 1) of the wafer (substrate) transfer apparatus. In the configuration in which the gate valve is provided for only one of the wafer accommodating chambers 32 adjacent to each other in the width direction, the footprint of the wafer transfer apparatus in the width direction (X direction in FIG. 1) can be reduced.

Further, in the present embodiment, the vacuum transfer apparatus 30 includes the temperature control chamber 32, so that the wafer W can be pre-heated or pre-cooled in the temperature control chamber 32. Therefore, the processing time in each vacuum processing chamber 40 can be shortened. Accordingly, the productivity can be improved.

Conventionally, a module dedicated to pre-heating or pre-cooling and having a structure similar to that of the vacuum processing chamber 40 may be used. On the other hand, the processing system 1 including the vacuum transfer apparatus 30 of the present embodiment does not require the above-described dedicated module, so that the footprint of the processing system 1 can be further reduced.

Further, since the wafer W can be pre-heated or pre-cooled, the temperature difference between the substrate support 41 of the vacuum processing chamber 40 and the wafer W placed on the substrate support 41 can be reduced. Accordingly, the damages to the wafer W and the substrate support 41 due to the temperature difference can be reduced.

Moreover, in the present embodiment, the temperature control chamber 32 is provided with the shield member 151 that surrounds the substrate support 110 and is configured to be vertically movable. The shield member 151 is driven by the lifting mechanism 124 for driving the support pins 121. In other words, a separate driving mechanism is not provided for the shield member 151, and the shield member 151 and the support pin 121 are driven by the common driving mechanism. Accordingly, space saving and cost reduction can be achieved.

Further, in order to exhaust the inside of the shield member 151, an opening may be formed at the shield member 151 in addition to the inlet/outlet 151a.

Figure 17:
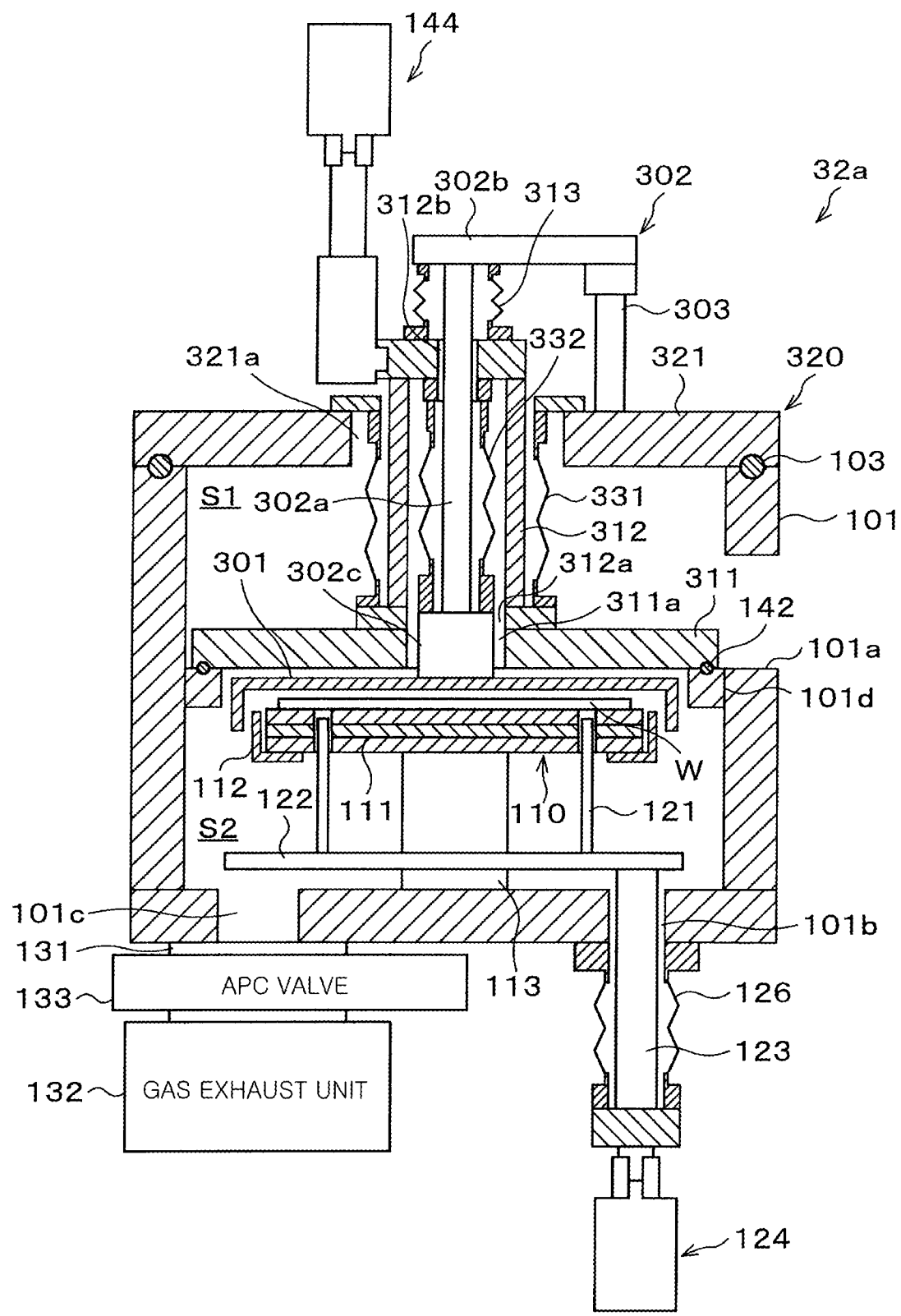
FIG. 17 shows another example of the temperature control chamber.

FIG. 17 shows another example of the temperature control chamber.

In the temperature control chamber 32 described with reference to FIG. 2, the shield member 151 is formed in a box shape that surrounds substantially the entire substrate support 110.

In the temperature control chamber 32a of FIG. 17, the shield member 301 is formed in a shape that surrounds only an upper portion of the substrate support 110. Specifically, the shield member 301 has a U-shaped cross section with a lower side opened. Similar to the shield member 151, the shield member 301 can suppress the inflow of the components vaporized from the wafer W in the second space S2 into the vacuum transfer chamber $31_2$, or the shield member 301 can prevent the foreign substances generated by the contact between a valve body 311 to be described later and the annular convex portion 101d from adversely affecting the wafer W on the substrate support 110.

In this example, a lower end of the outer peripheral portion of the shield member 301 is positioned lower than the upper surface of the wafer W on the substrate support 110 and the upper end of the outer peripheral portion of the cover member 112. Therefore, the cover member 112 can prevent foreign substances generated by the contact between the valve body 311 and the annular convex portion 101d from affecting the wafer W on the substrate support 110.

In the illustrated example, the outer peripheral portion of the cover member 112 is disposed inside the shield member 301. However, the outer peripheral portion of the cover member 112 may be disposed outside the shield member 301.

In the temperature control chamber $32_2$ of FIG. 2, the shield member 151 is driven by the lifting mechanism 124. However, in the temperature control chamber 32a of FIG. 17, the shield member 301 is driven by the driving mechanism 144 for driving the valve body 311. Therefore, the shield member 301 and the valve body 311 are configured to be connected to each other. Specifically, a support member 302 serving as a shield support member for supporting the shield member 301 and a position regulating member 303 for regulating a vertical position of the shield member 301 by contact with the bottom of the moving support member 302 are provided. Further, the valve body 311 is elastically connected to the support member 302. Specific description thereof will be provided below.

A lower end of a support column 302a extending vertically through an opening 321a formed in the lid 321 of a housing 320 is connected to a central portion of an upper surface of the shield member 301. An upper end of the support column 302a is connected to a plate-shaped member 302b extending horizontally. The support column 302a and the plate-shaped member 302b constitute the support member 302 for supporting the shield member 301.

The position regulating member 303 provided for the support member 302 extends vertically and has a lower end connected to the upper surface of the lid 321 of the housing 320. The position regulating member 303 regulates the vertical position of the shield member 301 by contact with the bottom of the support member 302, which moves together with the vertically moving shield member 301. Specifically, the vertical position of the shield member 301 is regulated by bringing a bottom surface of the plate-shaped member 302b into contact the position regulating member 303.

At the center of the valve body 311, an opening 311a is formed so that a lower portion of the support column 302a penetrates therethrough to connect with the shield member 301. Further, a lower end of a tubular member 312 extending vertically through the opening 321a of the lid 321 is connected to the upper surface of the valve body 311 around the opening 311a. The tubular member 312 has a hollow tubular shape, and the support column 302a vertically extends therethrough. An opening 312a is formed at the lower end of the tubular member 312 so that a flange 302c formed at the lower portion of the support column 302a penetrates therethrough, and an opening 312b is formed at an upper end of the tubular member 312 so that the upper portion of the support column 302a penetrates therethrough.

Further, the upper end of the tubular member 312 is connected to the driving mechanism 144. A lower end of an elastic member 313 is connected to an upper surface of the tubular member 312 around the opening 312b. An upper end of the elastic member 313 is connected to the bottom surface of the plate-shaped member 302b around a portion where the support column 302a is connected.

With the configuration described above, the valve body 311 and the support member 302 are elastically connected through the elastic member 313.

Therefore, when the driving mechanism 144 is driven, the valve body 311 is vertically moved and the shield member 301 is vertically moved together with the valve body 311 (except when the shield member 301 is in contact with the position regulating member 303). Further, even after the lowering of the shield member 301 is stopped by the regulation of the position regulating member 303, the valve body 311 can continue to be lowered by itself. Therefore, in the configuration in which the shield member 301 and the valve body 31 are both driven by the driving mechanism 144, the valve body 311 can be pressed with an appropriate force to the annular convex portion 101d while accurately aligning the substrate support 110 and the shield member 301 in the vertical direction.

Further, bellows 331 and 332 are provided to prevent the loss of the airtightness in the housing 320 caused due to the opening 321a of the lid 321 of the housing 320 or the opening 312b formed at the upper end of the tubular member 312. The bellows 331 is disposed between the valve body 311 and the portion where the tubular member 312 penetrates through the lid 321 of the housing 320 to surround the outer peripheral portion of the support column 302a in the housing 320. Further, the bellows 332 is disposed between the flange 302c formed at the lower end of the support column 302a and the portion where the support column 302a penetrates through the upper end of the tubular member 312 to surround the outer periphery of the support column 302a in the tubular member 312.

Figure 18:
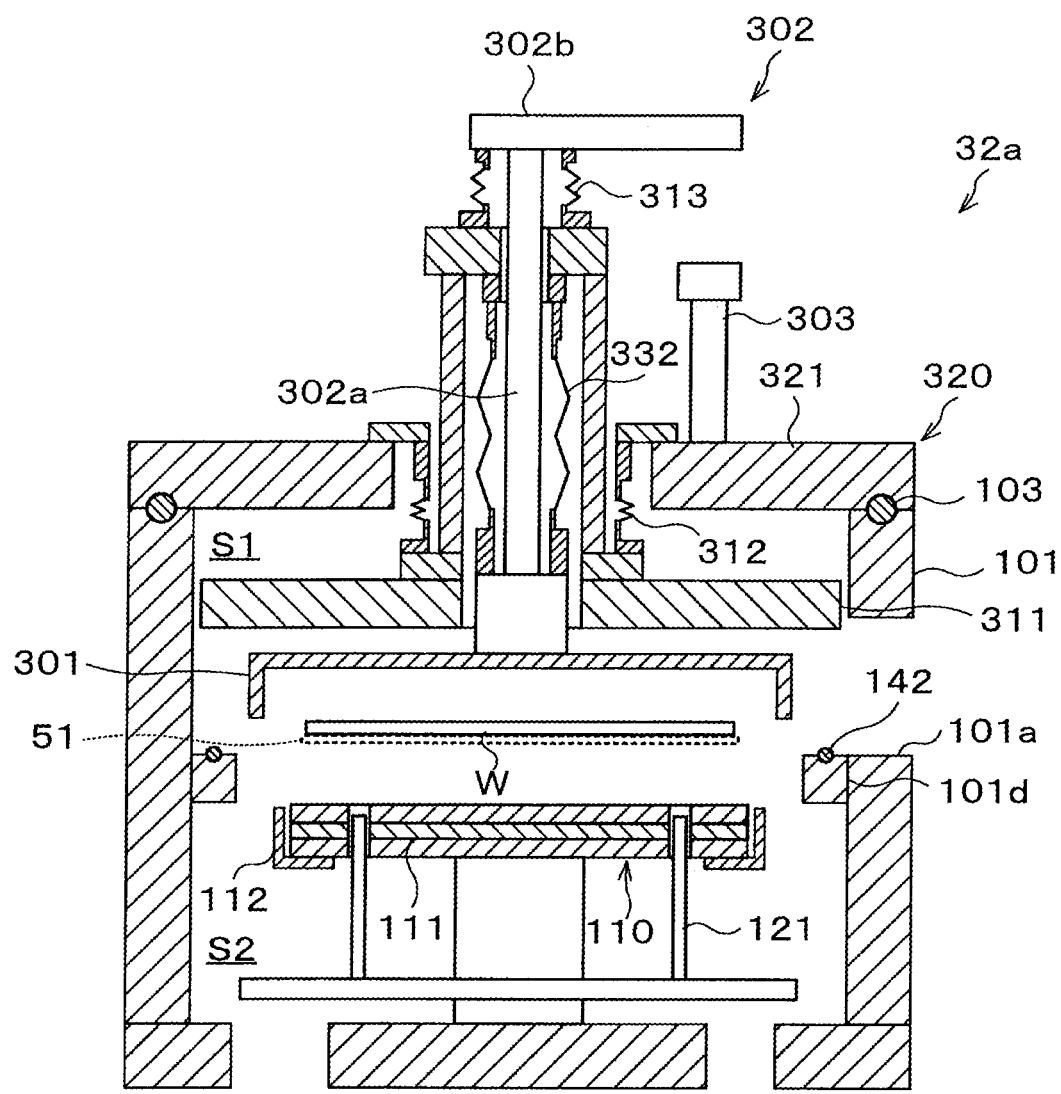
FIGS. 18 to 20 show states of the wafer accommodating chamber to explain an operation with a shield member in the temperature control chamber of FIG. 17.
Figure 19:
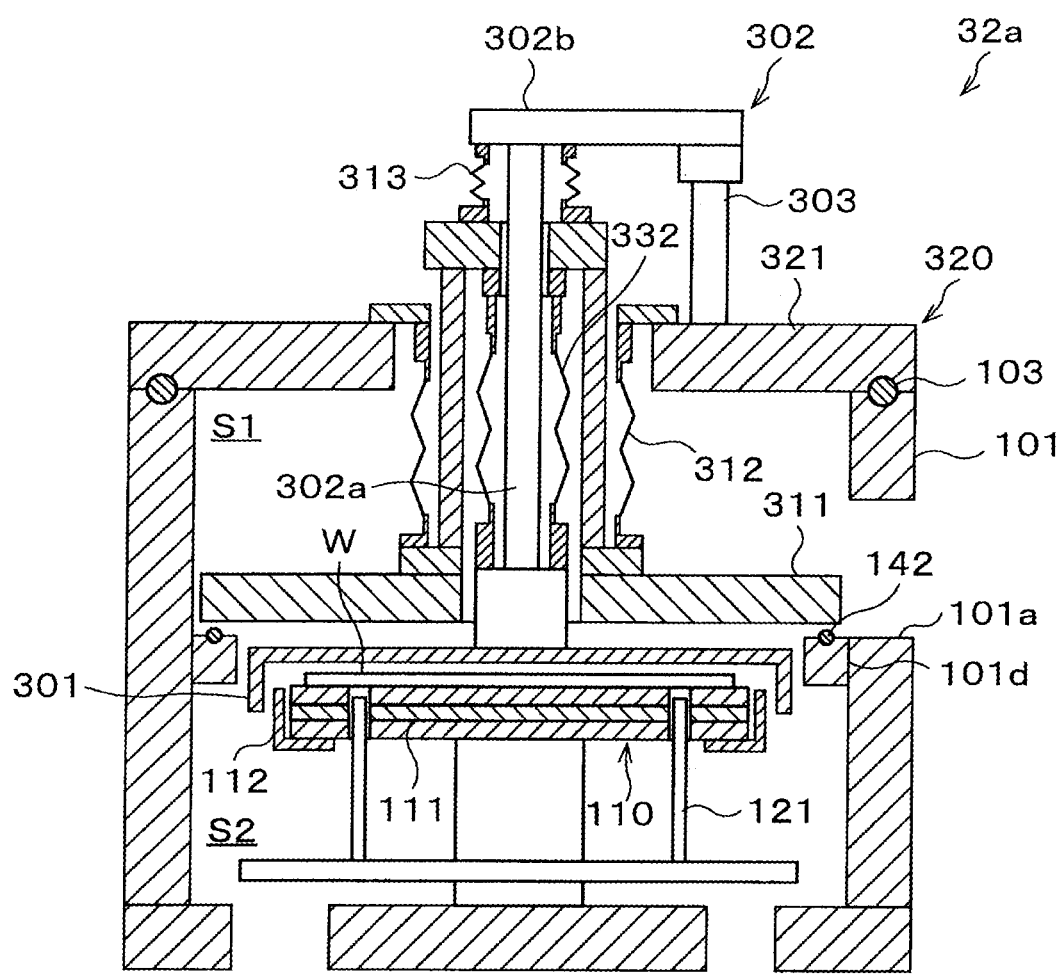
Figure 20:
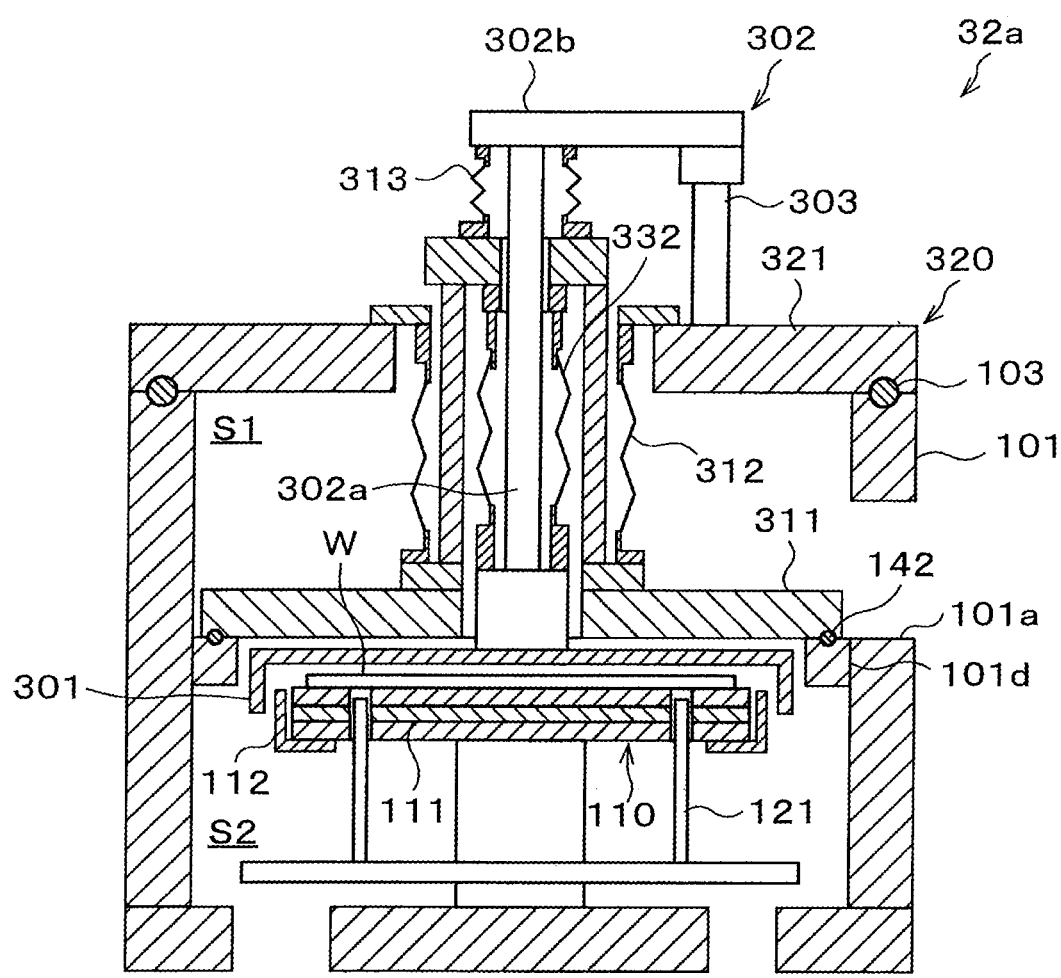

Next, the operation of the shield member 301 and the valve body 311 in the temperature control chamber 32a will be described with reference to FIGS. 18 to 20. FIGS. 18 to 20 show the states of the wafer accommodating chamber 32.

As shown in FIG. 18, when the valve body 311 is raised by the driving mechanism 144 to the open position, the shield member 301 is also raised to a position above the transfer arm 51 that has entered the temperature control chamber 32a through the loading/unloading port 101a. In this state, the wafer W is transferred between the transfer arm 51 and the substrate support 110 by the support pins 121.

For example, the wafer W is transferred from the transfer arm 51 to the substrate support 110, the driving mechanism 144 lowers the valve body 311 and the shield member 301. When the valve body 311 and the shield member 301 are lowered, first, as shown in FIG. 19, the bottom surface of the plate-shaped member 302b of the support member 302 of the shield member 301 is brought into contact with the upper surface of the position regulating member 303, and the lowering of the shield member 301 is stopped. Accordingly, the vertical position of the shield member 301 is regulated.

Since, however, the valve body 311 is elastically connected to the support member 302 for supporting the shield member 301 as described above, the valve body 311 can be further lowered even if the lowering of the shield member 301 is stopped.

When the valve body 311 is further lowered, as shown in FIG. 20, the valve body 311 is brought into contact with the upper surface of the annular convex portion 101d through the O-ring 142. In other words, the valve body 311 is located at the closed position. Accordingly, the first space S1 and the second space S2 are airtightly separated.

When the valve body 311 is raised from the closed position, first, the valve body 311 is raised alone. Then, when the length of the elastic member 313 reaches a predetermined length determined by its spring constant or the like, the shield member 301 is raised together with the valve body 311.

As described above, in this example, the valve body 311 is vertically moved by driving the driving mechanism 144, and the shield member 301 is also vertically moved (except when the shield member 301 is in contact with the position regulating member 303). Further, even after the lowering of the shield member 301 is stopped by the regulation of the position regulating member 303, the valve body 311 can continue to be lowered by itself. Therefore, in the configuration in which the shield member 301 and the valve body 311 are both driven by the driving mechanism 144, the valve body 311 can be pressed with an appropriate force to the annular convex portion 101d while accurately aligning the substrate support 110 and the shield member 301 in the vertical direction.

In the above described embodiments, although the film formation has been described as an example, the substrate transfer apparatus of the present embodiment can also be used in the case of performing another treatment such as etching instead of, or in addition to, the film formation.

The presently disclosed embodiments are considered in all respects to be illustrative and not restrictive. The above-described embodiments can be embodied in various forms. Further, the above-described embodiments may be omitted, replaced, or changed in various forms without departing from the scope of the appended claims and the gist thereof.

The following configurations are also included in the technical scope of the present disclosure.

(1) There is provided a substrate accommodating unit of a substrate transfer apparatus in which multiple vacuum transfer units, each having therein a substrate transfer mechanism configured to hold and transfer a substrate, are arranged consecutively, the substrate accommodating unit being disposed adjacent to each of the vacuum transfer units in an arrangement direction of the vacuum transfer units. The substrate accommodating unit includes a hollow housing having, on one sidewall in the arrangement direction of the vacuum transfer units, a loading/unloading port for loading and unloading a substrate into and from the adjacent vacuum transfer unit; a partition member disposed in the housing and configured to be vertically movable; and a driving mechanism configured to vertically move the partition member. Further, when an inner space of the housing is divided horizontally into a first space on a loading/unloading port side and a second space on an opposite side of the loading/unloading port side, the partition member is vertically moved from a state where the first space and the second space communicate with each other to thereby airtightly separate the first space and the second space with the partition member.

In accordance with the configuration (1), it is possible to achieve the downsizing of the substrate transfer apparatus in which the vacuum transfer units are arranged consecutively and the substrate accommodating unit is disposed adjacent to each of the vacuum transfer units in the arrangement direction of the vacuum transfer units.

(2) In the substrate accommodating unit of the configuration (1), a substrate support on which the substrate is placed may be disposed in the second space of the housing.

(3) In the substrate accommodating unit of the configuration (2), the substrate support may have a heating mechanism configured to heat the substrate placed thereon.

(4) The substrate accommodating unit of the configuration (3) may further include a shield member that surrounds the substrate support and is configured to be vertically movable.

In accordance with the configuration (4), when the valve body is moved to an open position after the substrate is heated using the substrate support, it is possible to prevent the components vaporized from the substrate in the second space from flowing into the adjacent vacuum transfer unit. Further, it is possible to suppress that the heat from the substrate support affects the outside member such as the housing.

(5) In the substrate accommodating unit of the configuration (4), the shield member may be formed in a box shape having an inlet/outlet for the substrate on a sidewall thereof.

(6) The substrate accommodating unit of the configuration (5) may further include an annular member attached to an outer peripheral portion of the substrate support. Further, when the first space and the second space are airtightly separated by the partition member, an upper end of the inlet/outlet of the shield member may be lower than an upper end of the annular member while the substrate support to which the annular member is attached is surrounded by the shield member.

In accordance with the configuration (6), the annular member can prevent foreign substances from entering the shield member through the inlet/outlet.

(7) The substrate accommodating unit of any one of the configurations (4) to (6) may further include substrate support pins configured to support the substrate when the substrate is transferred between the substrate support and the substrate transfer mechanism of the adjacent vacuum transfer unit; and a pin driving mechanism configured to vertically move the substrate support pins. Further, the shield member may be vertically moved by driving the pin driving mechanism.

In accordance with the configuration (7), space saving and cost reduction can be achieved.

(8) In the substrate accommodating unit of the configuration (4), the shield member may be vertically moved by the driving mechanism.

In accordance with the configuration (8), the space saving and the cost reduction can be achieved.

(9) The substrate accommodating unit of the configuration (8) may further include a shield support member configured to support the shield member; and a position regulating member configured to regulate a vertical position of the shield member by contact with a bottom surface of the shield support member. Further, the partition member may be elastically connected to the shield support member.

In accordance with the configuration (9), the first space and the second space can be airtightly separated by the valve body (the partition member) while accurately aligning the shield member in the vertical direction.

(10) In the substrate accommodating unit of the configuration (1) or (2), the housing has an additional loading/unloading port for loading and unloading the substrate into and from another adjacent vacuum transfer unit on a sidewall thereof on the second space side that is the other sidewall in the arrangement direction of the vacuum transfer units.

(11) There is provided a substrate transfer apparatus including the substrate accommodating unit described in the configurations (1) to (10) that is disposed adjacent to each of the vacuum transfer units in the arrangement direction of the vacuum transfer units.

(12) There is provided a maintenance method for vacuum transfer units of a substrate transfer apparatus in which the vacuum transfer units, each having therein a substrate transfer mechanism configured to hold and transfer a substrate, are arranged consecutively via at least one substrate accommodating unit disposed adjacent to each of the vacuum transfer units in the arrangement direction of the vacuum transfer units, the substrate accommodating unit including a hollow housing having, on one sidewall in an arrangement direction of the vacuum transfer units, a loading/unloading port for loading and unloading the substrate into and from the adjacent vacuum transfer unit; and a vertically movable partition member disposed in the housing. The method includes airtightly separating, when an inner space of the housing is divided horizontally into a first space on the loading/unloading port side and a second space on the opposite side of the loading/unloading port side, the first space and the second space by the partition member by vertically moving the partition member from a state where the first space and the second space communicate with each other; and opening only the adjacent vacuum transfer unit communicating with one of the first space and the second space to the atmosphere.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

What is claimed is:

1. A substrate accommodating unit of a substrate transfer apparatus in which multiple vacuum transfer units, each having therein a substrate transfer mechanism configured to hold and transfer a substrate, are arranged consecutively, the substrate accommodating unit being disposed adjacent to each of the vacuum transfer units in an arrangement direction of the vacuum transfer units, the substrate accommodating unit comprising:
   a hollow housing having, on one sidewall in the arrangement direction of the vacuum transfer units, a loading/unloading port for loading and unloading a substrate into and from the adjacent vacuum transfer unit;
   a partition member disposed in the housing and configured to be vertically movable; and
   a driving mechanism configured to vertically move the partition member,
   wherein when an inner space of the housing is divided horizontally into a first space on a loading/unloading port side and a second space on an opposite side of the loading/unloading port side, the partition member is vertically moved from a state where the first space and the second space communicate with each other to thereby airtightly separate the first space and the second space with the partition member,
   the substrate accommodating unit further comprising:
   a substrate support disposed in the second space of the housing, the substrate being placed on the substrate support;
   a shield member that surrounds the substrate support and is configured to be vertically movable; and
   an annular member disposed in the shield member and attached to an outer peripheral portion of the substrate support.

2. The substrate accommodating unit of claim 1, wherein the substrate support has a heating mechanism configured to heat the substrate placed thereon.

3. The substrate accommodating unit of claim 1, wherein the shield member is formed in a box shape having an inlet/outlet for the substrate on a sidewall thereof.

4. The substrate accommodating unit of claim 3,
   wherein when the first space and the second space are airtightly separated by the partition member, an upper end of the inlet/outlet of the shield member is lower than an upper end of the annular member while the substrate support to which the annular member is attached is surrounded by the shield member.

5. The substrate accommodating unit of claim 4, further comprising:
   substrate support pins configured to support the substrate when the substrate is transferred between the substrate support and the substrate transfer mechanism of the adjacent vacuum transfer unit; and
   a pin driving mechanism configured to vertically move the substrate support pins,
   wherein the shield member is vertically moved by driving the pin driving mechanism.

6. The substrate accommodating unit of claim 3, further comprising:
   substrate support pins configured to support the substrate when the substrate is transferred between the substrate support and the substrate transfer mechanism of the adjacent vacuum transfer unit; and
   a pin driving mechanism configured to vertically move the substrate support pins,
   wherein the shield member is vertically moved by driving the pin driving mechanism.

7. The substrate accommodating unit of claim 1, further comprising:
 substrate support pins configured to support the substrate when the substrate is transferred between the substrate support and the substrate transfer mechanism of the adjacent vacuum transfer unit; and
 a pin driving mechanism configured to vertically move the substrate support pins,
 wherein the shield member is vertically moved by driving the pin driving mechanism.

8. The substrate accommodating unit of claim 1, wherein the shield member is vertically moved by the driving mechanism.

9. The substrate accommodating unit of claim 8, further comprising:
 a shield support member configured to support the shield member and extend vertically through the housing; and
 wherein a vertical position of the shield member is regulated by contact with a bottom surface of the shield support member which moves vertically together with the shield member, and
 wherein the partition member is elastically connected to the shield support member.

10. A substrate transfer apparatus in which multiple vacuum transfer units, each having therein a substrate transfer mechanism configured to hold and transfer a substrate, are arranged consecutively, the substrate transfer apparatus comprising:
 a substrate accommodating unit disposed adjacent to each of the vacuum transfer units in an arrangement direction of the vacuum transfer units,
 the substrate accommodating unit including:
  a hollow housing having, on one sidewall in the arrangement direction of the vacuum transfer units, a loading/unloading port for loading and unloading a substrate into and from the adjacent vacuum transfer unit;
  a partition member disposed in the housing and configured to be vertically movable; and
  a driving mechanism configured to vertically move the partition member,
  wherein when an inner space of the housing is divided horizontally into a first space on a loading/unloading port side and a second space on an opposite side of the loading/unloading port side, the partition member is vertically moved from a state where the first space and the second space communicate with each other to thereby airtightly separate the first space and the second space with the partition member,
 the substrate accommodating unit further comprising:
  a substrate support disposed in the second space of the housing, the substrate being placed on the substrate support;
  a shield member that surrounds the substrate support and is configured to be vertically movable; and
  an annular member disposed in the shield member and attached to an outer peripheral portion of the substrate support.

\* \* \* \* \*